United States Patent
De Wilde et al.

(10) Patent No.: US 7,619,431 B2
(45) Date of Patent: Nov. 17, 2009

(54) HIGH SENSITIVITY MAGNETIC BUILT-IN CURRENT SENSOR

(75) Inventors: Johannes De Wilde, Eindhoven (NL); Jose De Jesus Pineda De Gyvez, Eindhoven (NL); Franciscus Gerardus Maria De Jong, Eindhoven (NL); Josephus Antonius Huisken, Eindhoven (NL); Hans Marc Bert Boeve, Eindhoven (NL); Kim Phan Le, Eindhoven (NL)

(73) Assignee: NXP B.V., Eindhoven (NL)

( * ) Notice: Subject to any disclaimer, the term of this patent is extended or adjusted under 35 U.S.C. 154(b) by 148 days.

(21) Appl. No.: 10/596,644

(22) PCT Filed: Dec. 20, 2004

(86) PCT No.: PCT/IB2004/052857

§ 371 (c)(1),
(2), (4) Date: Jun. 20, 2006

(87) PCT Pub. No.: WO2005/064356

PCT Pub. Date: Jul. 14, 2005

(65) Prior Publication Data

US 2007/0063690 A1    Mar. 22, 2007

(30) Foreign Application Priority Data

Dec. 23, 2003   (EP) .................................. 03104937
Nov. 16, 2004   (EP) .................................. 04105805

(51) Int. Cl.
*G01R 31/26* (2006.01)
*G11C 11/00* (2006.01)

(52) U.S. Cl. ....................................... 324/763; 365/158

(58) Field of Classification Search ....................... None
See application file for complete search history.

(56) References Cited

U.S. PATENT DOCUMENTS

| | | | | |
|---|---|---|---|---|
| 5,708,407 A | * | 1/1998 | Mouchot et al. | 324/252 |
| 5,901,018 A | * | 5/1999 | Fontana et al. | 360/324.2 |
| 5,963,038 A | * | 10/1999 | De Jong et al. | 324/537 |
| 6,028,427 A | * | 2/2000 | Kawase | 324/249 |
| 6,134,060 A | * | 10/2000 | Ryat | 360/46 |
| 6,144,214 A | * | 11/2000 | Athan | 324/763 |
| 6,300,617 B1 | * | 10/2001 | Daughton et al. | 324/252 |
| 6,870,716 B2 | * | 3/2005 | Gill | 360/324.12 |
| 7,324,369 B2 | * | 1/2008 | Chung et al. | 365/158 |
| 2007/0099031 A1 | * | 5/2007 | Chung et al. | 428/815 |
| 2007/0120209 A1 | * | 5/2007 | Phan Le | 257/427 |
| 2008/0112214 A1 | * | 5/2008 | Chung et al. | 365/158 |
| 2008/0205110 A1 | * | 8/2008 | Boeve | 324/252 |

\* cited by examiner

*Primary Examiner*—Jermele M Hollington

(57) ABSTRACT

A sensor for contactlessly detecting currents, has a sensor element having a magnetic tunnel junction (MTJ), and detection circuitry, the sensor element having a resistance which varies with the magnetic field, and the detection circuitry is arranged to detect a tunnel current flowing through the tunnel junction. The sensor element may share an MTJ stack with memory elements. Also it can provide easy integration with next generation CMOS processes, including MRAM technology, be more compact, and use less power. Solutions for increasing sensitivity of the sensor, such as providing a flux concentrator, and for generating higher magnetic fields with a same current, such as forming L-shaped conductor elements, are given. The greater sensitivity enables less post processing to be used, to save power for applications such as mobile devices. Applications include current sensors, built-in current sensors, and IDDQ and IDDT testing, even for next generation CMOS processes.

21 Claims, 18 Drawing Sheets

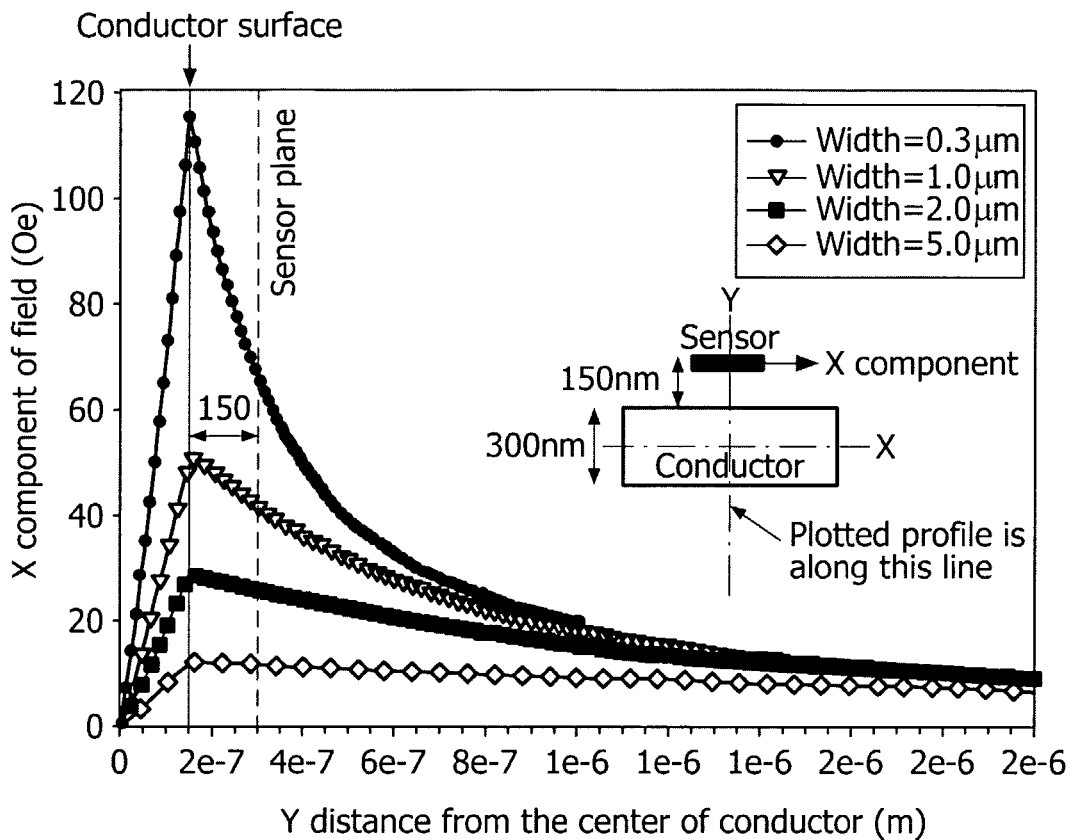
FIG. 12
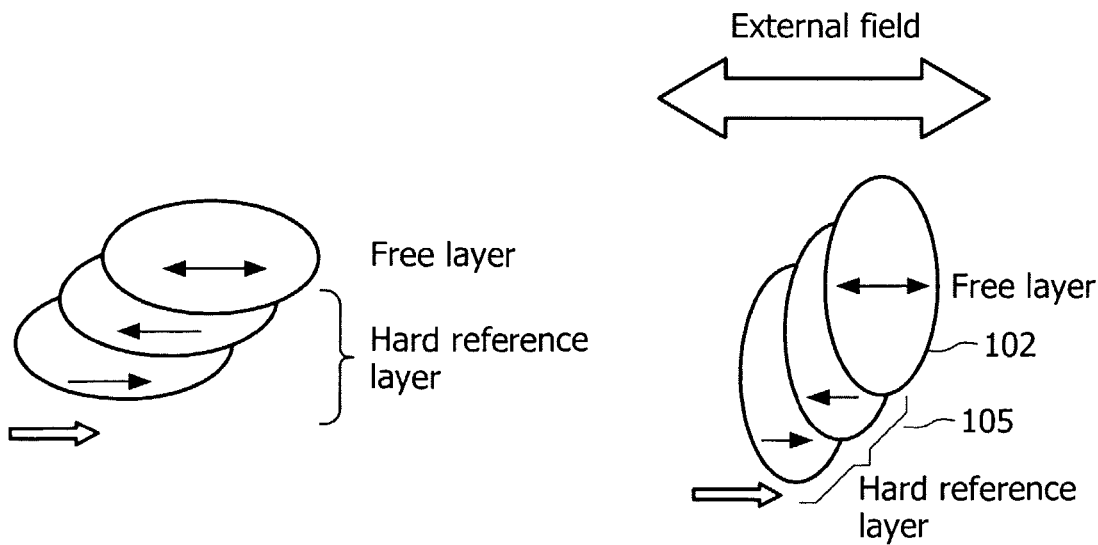
FIG. 13
FIG. 14

Concentration

Depth 241
221
F₁
220
F₂
260
103
105
107

HIGH SENSITIVITY MAGNETIC BUILT-IN CURRENT SENSOR

CROSS-REFERENCE TO RELATED APPLICATIONS

This application is a 371 of PCT/IB04/52857 filed on Dec. 20, 2004, the entirely of which is hereby incorporated by reference herein.

FIELD OF THE INVENTION

This invention relates to current sensors for sensing of current in a conductor, to integrated circuits having such a sensor built-in, to methods of using such sensors, and to methods for sensing current in a conductor in a semiconductor device such as an integrated circuit, amongst others as well as software products for implementing the methods of use.

BACKGROUND OF THE INVENTION

There are various types of known BICS (Built In Current Sensor). Some are described in U.S. Pat. No. 5,963,038, which shows detecting faults in integrated circuits by measurement of current through a conductor in the integrated circuit by means of a sensor situated in the vicinity of the conductor. The sensor can be constructed in various ways so as to measure the field produced by the current through the conductor. Examples disclosed include a Hall sensor, an MR (magnetoresistive) sensor and a GMR (giant magnetoresistive) sensor. This can enable testing of conductors and their connections which cannot be accessed easily by external test equipment, or for detecting faults in individual ones of parallel paths which would pass a resistivity test even if only one path was conducting.

An MR sensor has a resistance that is dependent on an external magnetic field in the plane of the sensor. Different types of MR sensors exist. Sensors based on anisotropic magnetoresistance (AMR), have been used in magnetic recording heads for several years. AMR sensors have a layer of anisotropic magnetic material and the resistance of this layer is influenced by an external magnetic field, which causes the change in the sense current which flows in the layer. A GMR (Giant MagnetoResistive) sensor has a layer of magnetic material in a fixed direction (pinned layer) and a layer of magnetic material of which the magnetisation direction can be influenced by an external magnetic field (free layer), which causes the change in measured resistance. Depending on the type and construction, an MR sensor is more sensitive in one direction and less sensitive in another direction in the plane of the sensor. The MR sensor shown in the above patent is illustrated in FIG. 1. It is constructed to maximise the effect from the current through the conductor on the resistance of the sensor. FIG. 1 shows an MR (magnetoresistive) sensor 502 situated near conductor 104 in a layer of the integrated circuit above or beneath the layer in which the conductor is realised. The MR sensor 502 comprises connection areas 504 and 506 to which through holes 508 and 510 are connected for measuring the actual resistance of the sensor 502.

The current through the conductor 104 causes a circular magnetic field around the conductor 104 through the plane of the sensor 502 and perpendicular to the conductor 104 in the plane of the sensor 502. The MR sensor 502 is sensitive in this direction, so its resistance is measured along the plane of the sensor 502, parallel to the conductor plane to measure the strength of the magnetic field produced by direct current through the conductor 104. A traditional AMR sensor or a GMR (giant magnetoresistive) sensor can be used.

FIG. 2 shows an alternative arrangement of the MR sensor in the integrated circuit known from the above patent. An MR sensor 602 is situated near the bond pad 106 to which the bond wire 108 is connected. The MR sensor 602 has connection areas 604 and 606 for connecting the sensor 602 to respective through holes 608 and 610. The typical attachment of the bond wire 108 to the bond pad 106 is such that near the bond pad 106 the bond wire 108 is to a certain degree perpendicular to the surface of the bond pad 106. A current through the bond wire 108 then causes a magnetic field 612 in the plane of the bond pad 106 and the MR sensor 602, thus causing a change of the resistance of the MR sensor 602. A second MR sensor 614 may be situated at another side of the bond pad and combined with the MR sensor 602 in order to obtain an arrangement that is more sensitive to the magnetic field 612 than a single MR sensor. In FIG. 2, the MR sensors are positioned perpendicular to the magnetic field 612. They may be positioned at different angles to the magnetic field according to which position is more sensitive. In any case, the resistance of the sensor layer is still measured along the plane of the layer.

At a connection layer of the circuit, the through holes e.g. 508-510 and 608-610, are connected to connection tracks connecting the respective MR sensor 502, 602 to an internal detection circuit or to external measurement points. The resistance of the MR sensor 502, 602 can then be measured inside in the integrated circuit with the detection circuit or outside the integrated circuit with a suitable measurement arrangement.

Such sensors are useful for sensing high currents, but are not sufficiently sensitive for applications such as Quiescent Current (IDDQ) testing. IDDQ testing has shown very good coverage of physical defects such as gate oxide shorts, floating gates, and bridging faults which are not very well modelled by classical fault models, or undetectable by conventional logic tests. The demand for high quality and cost effectiveness has led to widespread use of IDDQ testing as a supplementary test to voltage tests. When combined with other test techniques, it has the potential for eliminating the need for burn-in test. However MOSFET leakage currents are rising rapidly with each technology node, narrowing the difference between the IDDQ levels of a faulty and fault-free circuit.

SUMMARY OF THE INVENTION

It is an object of the present invention to provide a sensor which is sensitive enough to measure small current on-chip such as IDDQ currents for testing.

In a first aspect, the present invention provides a semiconductor device with a conductive element and a current sensor. The current sensor is a magnetic current sensing device for sensing direct, varying or alternating current flowing through the conductive element. The current sensing device is integrated in the semiconductor device and is galvanically isolated from the conductive element. An advantage is greater sensitivity of the sensor compared to prior art sensors: the sensor may be suitable for measuring current with a μA resolution. The greater sensitivity enables less signal post processing and electronic circuitry to be used, which is important for applications such as mobile devices. Notably sufficient sensitivity can be obtained in principle for IDD measurements such as quiescent IDD current (IDDQ) or transient IDD current (IDDT), even for next generation CMOS processes which have more stringent IDD test requirements.

IDDQ is the quiescent current flowing from Vdd to Vss (IDD current) in CMOS circuitry, in a quiescent state. IDDT is the transient IDD current during digital transitions. Measuring the IDDQ and IDDT currents allow to detect faults within the CMOS circuitry.

The current sensing device may comprise at least one magnetoresistance device, such as a magnetic tunnel junction (MTJ) device, exhibiting the tunnel magnetoresistance (TMR) effect. In this embodiment, the sensor can provide easy integration with next generation CMOS processes such as MRAM technology. It can be more compact, and uses less power than prior art sensors.

The magnetic tunnel junction (MTJ), which according to an embodiment of the present invention may be used as a sensing element, has been developed previously for memory applications, and the inventors have appreciated that it could be adapted for use as a sensor, despite the fact that memory cells and current sensors must have different characteristics. In a memory cell, a magnetoresistance loop (MR loop) of a free layer should be square with a relatively large coercivity (in the order of a few tens of Oe) and having two distinct remanence states. Moreover, the centre of the loop must be at zero field. In contrast, a current sensor must have on the one hand as large susceptibility to magnetic field as possible (for high sensitivity) and on the other hand must have small or no hysteresis and linear characteristic within the measuring range. The current sensing device may share an MTJ stack with an MRAM device, whereby the MTJ stack may be of the conventional type or of the toggle type. This has the advantage that current sensors and MRAM elements may be fabricated in one go.

The current sensing device may be arranged to have a relationship between resistance and magnetic field which shows substantially no hysteresis.

The current sensing device may have a free magnetic layer which has an easy axis oriented at an angle between 70° and 110°, preferably to be substantially perpendicular to a field being measured, so as to minimise the hysteresis. The current sensing device may have an easy axis, wherein the easy axis of the free layer is caused by shape elongation.

The current sensing device may have a pinned magnetic layer with a magnetisation direction and a free magnetic layer having an easy axis, wherein the magnetisation direction of the pinned magnetic layer is oriented at an angle, with the easy axis of the free magnetic layer, preferably between 0° and 180°, more preferred between 45° and 135°, and still more preferred substantially perpendicular to the easy axis of the free magnetic layer, so to maximize the sensitivity of the signal to be measured. In order to suppress the hysteresis, the present invention includes deviations from this angle of 90°.

The current sensing device may be subjected to an additional, direct or constant magnetic field created by e.g. a second current in the vicinity of the device either to further suppress the hysteresis, when the additional field is applied substantially perpendicular to the field being measured, or to shift the measurement range, when the additional field is applied substantially parallel to the field being measured.

Alternatively, the current sensing device may be subjected to an additional alternating field created by the second current. The additional alternating field is used to modulate the field to be measured thus modulating the sensor signal. The signal to noise ratio can be then improved by using signal processing methods.

A semiconductor device according to the present invention may comprise adjacent a first side of the current sensing device a first conductor for conveying a current to be measured and adjacent a second side of the current sensing device a second conductor for conducting a current, the first conductor and the second conductor crossing but not being electrically connected. The free magnetic layer of the current sensing device has an easy axis, and the first conductor and the second conductor may each include an angle of substantially between 30° and 90° with respect to the easy axis of the current sensing device.

According to a further embodiment of the present invention, a semiconductor device may furthermore comprise a feedback circuit for measuring MR changes on the current sensing device, and for controlling current in the second conductor in such a way that no MR change is observed on the current sensing device. The current feedback circuit may have means for generating a feedback signal indicative of the current to be measured and conveyed by the first conductor.

At least one of the first conductor and the second conductor may comprise at least one vertical conduction component and at least one horizontal conduction component, there being a corner between the vertical conduction component and the horizontal conduction component, thus forming a conductor structure which at least includes an L-shaped part of which the corner is located adjacent the current sensing device. This has the advantage to generate stronger fields at the sensor location, with a same current.

A semiconductor device according to the present invention may furthermore comprise a flux-concentrator to increase the magnetic field at the location of the current sensing device. The flux-concentrator may comprise a dummy MTJ stack that is patterned around at least one vertical conduction component. In this case, the flux-concentrator may be manufactured in one go with the MRAM elements and the sensor element. The flux-concentrator may be ring-shaped and may comprise a gap between poles, the current sensing device being located in the gap.

The semiconductor device according to the present invention may comprise a sensor device which is compatible with CMOS or MOS processing.

The semiconductor device may be an integrated circuit.

The present invention also includes software products, which when executed on a processing device, implement applications using measured currents in accordance with the present invention.

Additional features which form dependent claims include the sensor element being planar and the tunnel current being directed perpendicular to the plane of the planar element. Another such feature is the element being arranged to have a relationship between resistance and field, which shows substantially no hysteresis. Another such feature is that the sensor element has a free magnetic layer which has an easy axis oriented at an angle, preferably between 70° and 110°, more preferred substantially perpendicular to the field being measured. This angle should preferably be close to 90° in order to be able to have the highest (absolute) signal and lowest hysteresis. Otherwise only the component along the 90° direction is measured. This explains why extra modulation or biasing schemes would be allowed in the perpendicular direction. Another such feature is that the junction comprises a pinned magnetic layer having a magnetisation oriented at an angle, preferably between 45° and 135°, more preferred substantially perpendicular to the easy axis of the free magnetic layer. Another such feature is that the detection circuitry comprises circuitry for applying a fixed voltage across the junction of the sensor element, and for feeding the tunnel current through a load, and an amplifier for amplifying the voltage across the load. Another such feature is that the detection circuitry comprises circuitry for actively clamping the voltage across the junction. Alternatively, the detection circuitry can work in a current mode in which a constant current supplied by a current source flows through the junction and the change in the voltage drop on the junction is the indication of its resistance change and an amplifier is used to amplify this voltage. Clearly the output can be anything from a logical signal indicating field detected or not, to an analog or digital signal indicating a measurement to a given level of precision. Suitable post processing of the detected output can be carried out to suit the precision or noise immunity of the application for example.

As an additional feature, a width of the sensor element in a direction parallel to a width of the conductor should be not larger, preferably less, than the width of the conductor. This can help to ensure a uniform field through the sensor.

Another aspect of the invention provides a sensor for sensing a magnetic field, having a magneto resistive sensing element with crossed anisotropy, i.e. the angle between the free magnetic layer and the pinned direction of the pinned magnetic layer is substantially 90°, such that an axis of elongation of the sensing element is substantially orthogonal to the magnetic field being sensed, i.e. includes an angle between 70° and 110°, preferably substantially 90° between the free magnetic layer and the field being sensed.

Another aspect provides an integrated circuit having a built in current sensor comprising a magnetoresistive current sensor with a sensitivity of greater than 100 µV per mA.

Another aspect provides an integrated circuit having a built in current sensor comprising a magnetoresistive current sensor arranged to sense quiescent current (IDDQ).

Another aspect provides corresponding methods of sensing magnetic field or of sensing current.

In a second aspect, the present invention provides the use of an integrated magnetic current sensing device which is galvanically not in contact with a conductive element, for sensing at least a direct, a varying or an alternating current flowing through the conductive element, wherein the sensing device is used for on-chip measurement of current.

The current sensor or sensors may be arranged to sense quiescent currents (IDDQ) or transient currents (IDDT). As an additional feature, the integrated circuit may have multiple current sensors of which the outputs are linked in a scan chain based mechanism such as boundary scan (IEEE standard 1149.1). An advantage of a current sensor in a semiconductor device according to the present invention is that it has a small physical size. Being small, it can easily be integrated in an IC. This built-in sensor makes the IDDQ measurement possible per circuit block inside an IC or per separately powered circuit in a constellation of circuits in a single package, like an MCM (multichip module) or MCP (multichip package). Also IDDT measurement per block becomes possible. With the expectation of further growing integration levels in the IC domain, this will be an important test and measurement capability.

Furthermore, when integrated, more functionality can be added for these sensors.

As an additional feature, the integrated circuit may have multiple current sensors of which the outputs are linked in a scan chain. The invention makes it possible to use a multitude of sensors to measure currents as consumed by different blocks to determine the part of the design that consumes too much or too little current. Faster debugging of the initial design is a key economic benefit. Additionally, wear-out of the IC during its lifetime can now be monitored. Looking for changes in current consumption during the actual lifetime may prevent unexpected failures. Among others, safety aspects for life-critical applications can be derived from this data.

Another capability is the measurement of the current in separate processing units or cores. The method may comprise measuring current in at least one processing module. The function is to determine the scheduling of tasks based on dynamic power distribution schemes. The cores are processing units that consume power and may get hot when running at their maximum capacity. Based on the current (power) measurement per processing unit, a more even processing load can be scheduled, especially in systems that have many parallel processing units. This prevents unnecessary waiting queues, but also excessive heat build up in a specific core may be prevented. Also power reduction schemes may be controlled in this way, thus preventing expensive heat transfer solutions at assembly level.

A novel, now feasible technique, is the control of the clock speed of at least one processing module to obtain a continuous matching with a pre-defined current consumption level. This will give a maximum performance versus battery life capability.

For this technique to work properly, the threshold levels for comparing the power consumption must be set in registers by software. This software can be a service routine that is closely matched with an operating system. The job scheduler part of the software must be capable of rescheduling, based on interrupts from the detection or from regular reading (polling) the values from registers. This hardware-controlled aspect is relatively new in scheduling software but is basically not different from software based scheduling that already exists.

In a third aspect, the present invention provides a method for sensing current in a conductor in a semiconductor device. The method comprises sensing a direct, a varying or an alternating current flowing in the conductor by performing contactless magnetic current sensing with a sensor integrated on the integrated circuit.

The method may comprise sensing a magnetic field caused by the current.

The present invention also provides a method comprising the measurement of current consumption and the generation of a warning signal if a pre-set current consumption threshold is superseded.

The present invention furthermore provides a method wherein a software based routine performs job scheduling over several processing units based on the measured currents that invoke either an interrupt or a register bit to be set.

In a further aspect of the present invention, a method is provided for manufacturing a current sensing device sharing an MTJ stack with an MRAM device. The MTJ stack may be of the conventional type (free magnetic layer having a non-zero net magnetisation) or of the toggle type (free magnetic layer having a zero net magnetisation). The manufactured MTJ stack comprises an electrically insulating material designed to form a magneto-resistive tunnelling barrier, a pinned magnetic region positioned on one side of the electrically insulating material, the pinned magnetic region having a magnetic moment vector adjacent the electrically insulating material, and a free magnetic region. The free magnetic region may be an unbalanced magnetic region. Alternatively, the free magnetic region may be a nearly balanced or balanced magnetic region positioned on an opposite side of the electrically insulating material, the free magnetic region having a magnetic moment vector adjacent the insulating material and oriented in a position parallel or antiparallel to the magnetic moment vector of the pinned magnetic region, the free magnetic region including an artificial anti-ferromagnetic (AAF) stack including N ferromagnetic layers which are antiferromagnetically coupled, where N is an integer greater than or equal to two.

If the free region has a net magnetic moment which is substantially zero, a method according to the present invention includes modifying the net magnetic moment of the free region so as to make it non-zero. This increases the sensitivity of a sensor of the toggle type. Modifying the net magnetic moment may comprise increasing or decreasing the magnetic moment of at least one of the ferromagnetic layers in the free magnetic regions, e.g. by at least partially removing or destroying one of the ferromagnetic layers of the free magnetic region, or locally converting the anti-ferromagnetic coupling into a ferromagnetic coupling.

BRIEF DESCRIPTION OF THE FIGURES

The features of any of the dependent claims can be combined with each other or with any of the independent claims. Further advantages will be apparent to those skilled in the art, especially over other prior art not known to the inventors. How the present invention may be put into effect will now be described with reference to the appended schematic drawings. Obviously, numerous variations and modifications can be made without departing from the claims of the present invention. Therefore, it should be clearly understood that the form of the present invention is illustrative only and is not intended to limit the scope of the present invention.

The features of the invention will be better understood by reference to the accompanying drawings, which illustrate preferred embodiments of the invention. In the drawings:

FIG. 12 shows a graph of magnetic field strength varying with distance from the conductor for various conductor widths, FIGS. 13 and 14 show orientations of layers of a prior art memory cell and a sensor according to an embodiment of the present invention, respectively.

FIG. 30 illustrates destruction of a magnetic layer of the AAF stack by means of ion implantation, according to a further embodiment of the present invention.

FIG. 31 illustrates hysteresis loops before and after annealing of an AAF stack comprising two 4 nm NiFe layers and a 0.7 nmRu interlayer.

Figure 1:
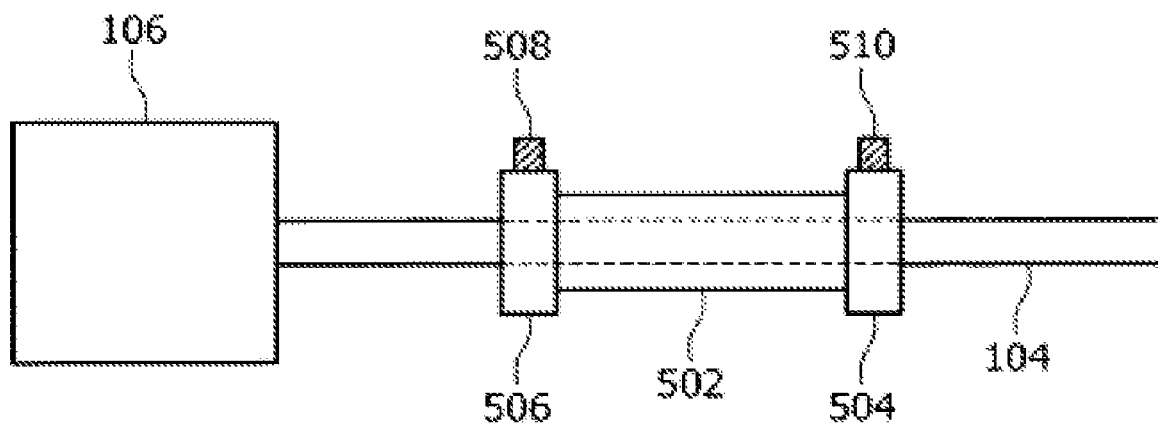
FIGS. 1 and 2 show prior art sensors.
Figure 2:
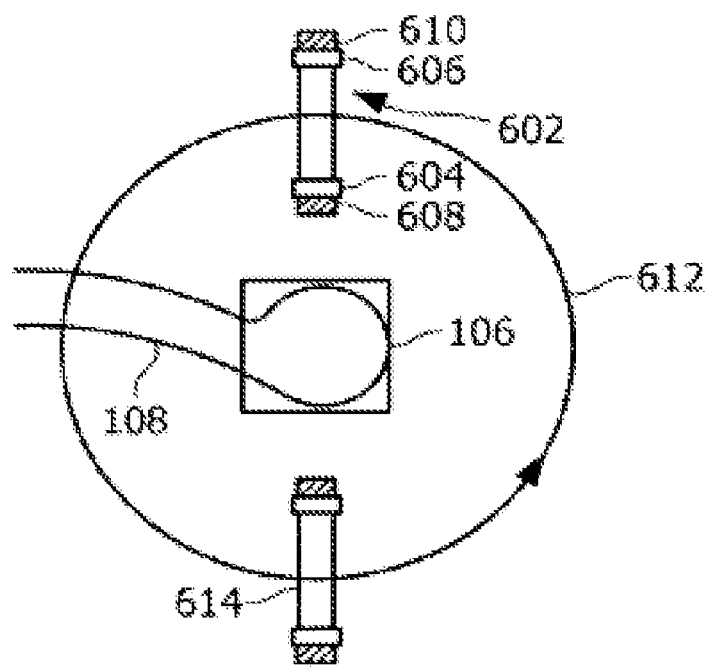

In the different Figures, the same reference signs refer to the same or analogous elements.

DETAILED DESCRIPTION

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

By way of introduction to the description of embodiments of the invention, MRAM development will be explained briefly. During recent years, research into Magnetic RAM (MRAM) has been intense. The integration of magnetic materials with CMOS technology has become less of a problem. Commercial MRAM production is planned in 2004-2005. A survey of MRAM technology is presented by K.-M. H. Lenssen et al, "Expectations of MRAM in comparison.", Non-Volatile Memory Technology Symposium 2000, (Nov. 15-16, 2000, Arlington Va., U.S.A.). This shows that first generation Magnetic Random Access Memory (MRAM) were based on AMR. After 1988 the discovery of a larger magnetoresistance effect called giant magnetoresistance (GMR), enabled the realisation of smaller elements with a higher resistance and a larger MR effect (5 to 15%), and therefore a higher output signal. This enabled, in principle, MRAMs for general applications. A decade after its discovery the GMR effect is already applied in commercial products like HDD read heads and magnetic sensors.

A breakthrough in the field of magnetic tunnel junctions around 1995 improved the prospects of MRAM even further, when a large tunnel magnetoresistance (TMR) effect was demonstrated at room temperature. Since then TMR effects with amplitudes up to >50% have been shown, but because of the strong bias-voltage dependence, the useable resistance change in practical applications is at present around 35%.

Figure 3:
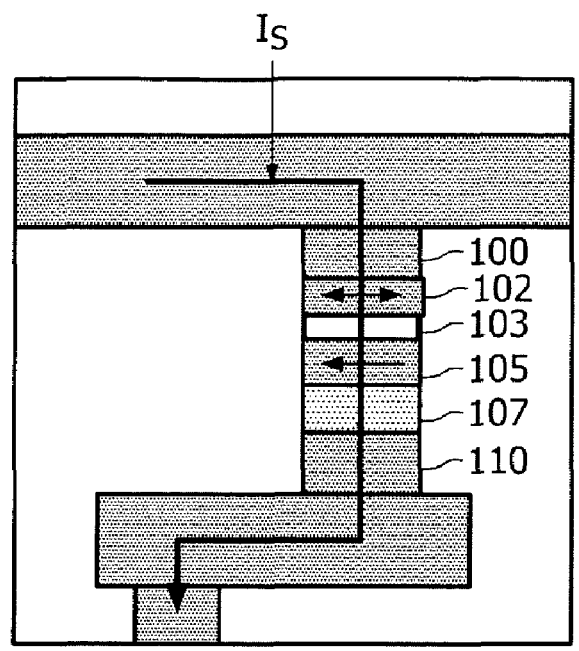
FIG. 3 shows a prior art MTJ memory cell.

An example of a cell for such a device is given in FIG. 3. This structure and how to manufacture are well known and need not be described again in detail here. To summarise, such a TMR-based MRAM contains cells which are magnetic tunnel junctions (MTJs). MTJs basically contain a free magnetic layer 102, an insulating layer (tunnel barrier) 103, a pinned magnetic layer 105 and an antiferromagnetic layer 107 which is used to "pin" the magnetisation of the pinned layer 105 to a fixed direction. In the example shown in FIG. 3, there is a layer structure having, in order, a top contact 100, a free magnetic layer 102, a tunneling barrier 103, a fixed magnetic layer 105, a pinning layer 107, and a bottom contact 110. The pinned layer 105 can comprise an artificial antiferromagnetic (AAF) structure. Furthermore, this concept can be introduced in the free layer 102 as well, to increase its magnetic volume, e.g. for thermal stability reasons while maintaining a low net magnetic moment responsible for the shape anisotropy and ultimately the required low switching fields (or thus the required low write power). It is to be noted that, at zero magnetic field, the free layer 102 clearly has a magnetic moment. It is therefore often referred to as artificial ferrimagnet (AFi). When used in MRAM cells, the conventional write mechanism as known to a person skilled in the art and shortly described hereinafter, can still be maintained for this more complex free layer.

The MRAM cells store binary information (1/0) in the directions of magnetisation of the free magnetic layer 102, which can be relatively free to rotate between two opposite directions. The resistance of the MTJ is small if the direction of magnetisation of the free layer 102 is parallel with that of the pinned layer 105 and is large when they are antiparallel. For reading information on a certain cell, a small sense current Is is sent through the MTJ stack (vertically) of the selected cell. The measured voltage drop on the MTJ stack (proportional to the resistance) is the indication of the information of the cell. The information on a cell can be changed during a write operation by sending write currents through word lines and bit lines, which are patterned at the bottom and on top of the memory cells. The currents will create magnetic fields (easy axis field and hard axis field) in the memory cell. The fields are programmed so that they are large enough to switch the magnetisation of the free layer 102 of the selected cell to a new direction, depending on the binary information to be stored into the selected cell.

In general, both GMR and TMR result in a low resistance if the magnetisation directions of the free layer 102 and the pinned layer 105 are parallel, and in a high resistance when the orientations of the magnetisation are antiparallel. In TMR devices the sense current has to be applied perpendicular to the layer planes (CPP, Current Perpendicular to Plane) because the electrons have to tunnel through the barrier layer. In GMR devices the sense current usually flows in the plane of the layers (CIP, Current In Plane). Nevertheless, supported by the rapidly continuing miniaturisation, the possibility of basing MRAMs on CPP TMR seems more likely.

Figure 4:
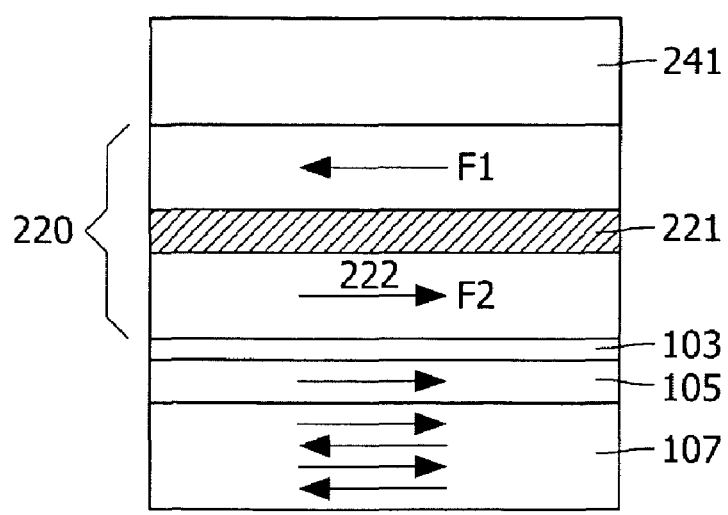
FIG. 4 is a vertical cross-section of a toggle type MRAM cell.

Recently Motorola has introduced a new MRAM concept called the toggle (or spin-flop) MRAM cell, as described in U.S. Pat. No. 6,545,906, and as illustrated in FIG. 4. According to this concept, the single free magnetic layer 102 of a conventional MRAM cell is replaced by a (nearly) balanced artificial antiferromagnetic (AAF) structure 220, while the rest of the stack is generally unchanged. Hereinafter this AAF structure is called the AAF free stack 220. The AAF free stack 220 consists of a plurality of N ferromagnetic layers, N being an integer number larger than one, in the example given in FIG. 4 two ferromagnetic layers $F_1$, $F_2$. Every two adjacent ferromagnetic layers $F_1$, $F_2$ are separated by an interlayer 221, which is a thin nonmagnetic layer, preferably a Ru layer. The thickness of the interlayer 221 is adjusted in such a way that an antiferromagnetic coupling is present between the two adjacent ferromagnetic layers $F_1$, $F_2$, which makes their magnetizations antiparallel at zero or small magnetic field. The thicknesses of the magnetic layers $F_1$, $F_2$ are chosen in such a way that the net magnetization of the AAF free stack 220 is substantially zero.

Figure 5:
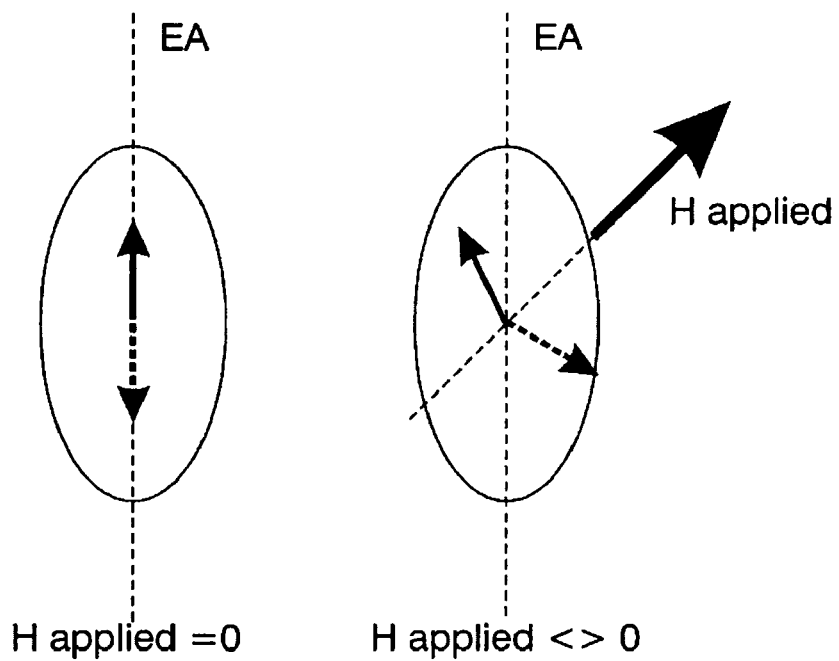
FIG. 5 illustrates the reaction of a balanced artificial anti-ferromagnetic stack, acting as a free layer, when no respectively an external field is applied.

An important feature of this concept is that due to the balance of the AAF free stack 220, this AAF free stack 220 has (almost) no net magnetic moment. This is because the magnetic moment $m_1 = S.t_1.M_1$ (product of the MTJ area S, the layer thickness $t_1$ and saturation magnetisation $M_1$ of the ferromagnetic layer $F_1$) of the first magnetic layer $F_1$ and the magnetic moment $m_2$ of the second magnetic layer $F_2$ are substantially equal, $m_1 = m_2$, and they are anti-parallel and thus cancel each other. At zero applied external field, the moments are aligned in the easy axis direction EA of the MTJ element, as illustrated at the left hand side of FIG. 5. In FIG. 5, the solid and dashed arrows in the elements represent the magnetic moments of the upper and lower magnetic layers $F_1$, $F_2$ respectively of the AAF free stack 220. The magnetic moments of the ferromagnetic layers $F_1$, $F_2$ are anti-ferromagnetically coupled, and form a magnetisation pair. When a magnetic field, exceeding the spin-flop field, is applied to the MTJ stack at a certain direction different from the easy axis direction, the magnetic moments will "flop" to align their vectorial sum into the direction of applied field direction (as illustrated at the right hand side of FIG. 5). The so-called spin-flop state is based on a subtle energy balance between the Zeeman energy (external field) and anti-ferromagnetic coupling energy.

The resistance of the total MTJ stack is dependent on the respective orientation between the magnetisation direction 222 of the lower magnetic layer $F_2$ of the AAF free stack 220 and the magnetisation direction of the pinned layer 105, and is used to define the memory states. The AAF free stack 220 can only be switched (between first and second logic states, e.g. 1-0) if a sufficiently high rotational magnetic field is applied. This rotational magnetic field is produced by sending two sequential pulses through the word and digit lines. These pulses are slightly shifted in time but still overlapping, as described in U.S. Pat. No. 6,545,906. The two lines are orthogonal with respect to each other and preferably make an angle of 45° with respect to the easy axis of the MTJ stack. The sequence of the two pulses creates a rotational field that continuously rotates the magnetisation pair of the free AAF stack 220 clockwise or counter-clockwise from an old to a new direction. Unselected cells are exposed at the most to only one of the pulses; and will relax back to the original position after the pulse ends. With this writing process the unselected cells do not switch, because they have not passed a maximum in the energy barrier.

The inventors have appreciated that MTJ devices, both of the conventional type and of the toggle type, can be used or adapted for use as magnetic field sensors. These have many applications, for example in contact-less measurements of currents flowing through a conductive element, e.g. power current or IDD current, contact-less being with respect to the conductive element. This can be in any kind of CMOS chip or other chip. Of course it can be implemented in MRAM chips. The same manufacturing technology used for MRAM cells can be used with little change, to build integrated current sensors according to embodiments of the present invention. They are particularly suitable for power pin testing and IDDx testing in MRAM chips or chips containing embedded MRAM, since implementation of these sensors may not need to cost any extra mask or extra process steps.

Due to the zero net magnetisation of the AAF free stack 220, a toggle type memory cell is more immune to an external magnetic field, and thus becomes more robust. This advantage for MRAM turns to be a disadvantage for sensor applications. Due to the immunity to the external field, the sensitivity of the magnetic sensors made from this stack is severely degraded, and is estimated to be one to two orders of magnitude lower than the conventional MRAM stack. The inventors have, nevertheless, appreciated that also such stacks can be used or adapted for use as magnetic field sensors, as disclosed below.

Figures 6A, 6B:
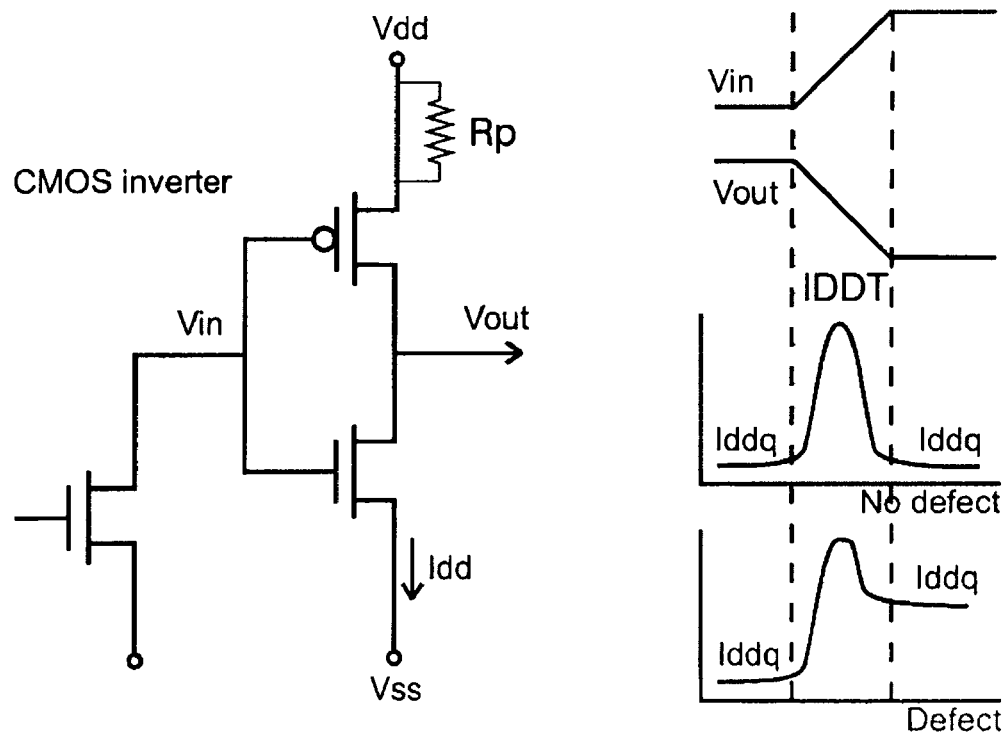
FIG. 6A illustrates a CMOS inverter.
FIG. 6B illustrates IDDQ current for non-defect and for defect circuitry when the input voltage Vin of the CMOS inverter of FIG. 6A changes from low to high.

In CMOS circuitry, for instance the CMOS inverter as shown in FIG. 6A, IDD is the current flowing from a high power supply level Vdd to a low power supply level Vss. When the circuitry is idle, meaning that there are no digital transitions within the circuitry, also called the quiescent state, IDD current is stable and has a small value called the quiescent IDD current or briefly IDDQ current. When there are any digital transitions taking place in the circuitry, such as e.g. $V_{in}$ changing from low to high and consequently $V_{out}$ changing from high to low (FIG. 6B, upper part), IDD current raises to a maximum called the transient IDD current or briefly IDDT current (FIG. 6B, middle and bottom part). Then, after the transition, it falls back again to the quiescent IDDQ level (FIG. 6B, middle part). The mentioned situation occurs when the circuitry is free of defects. In case there are any defects such as gate oxide shorts, floating gates, bridging faults, etc., as indicated by, for example, the parallel resistor $R_p$ in FIG. 6A, a significant increase in the IDDQ after transition is observed, as illustrated in the bottom graph of FIG. 6B. By monitoring the IDDQ current after transitions, defects of the circuitry can easily be detected.

IDDQ has been proved to be a very good testing method, which can cover a lot of faults not detected by other methods so far.

Figure 7:
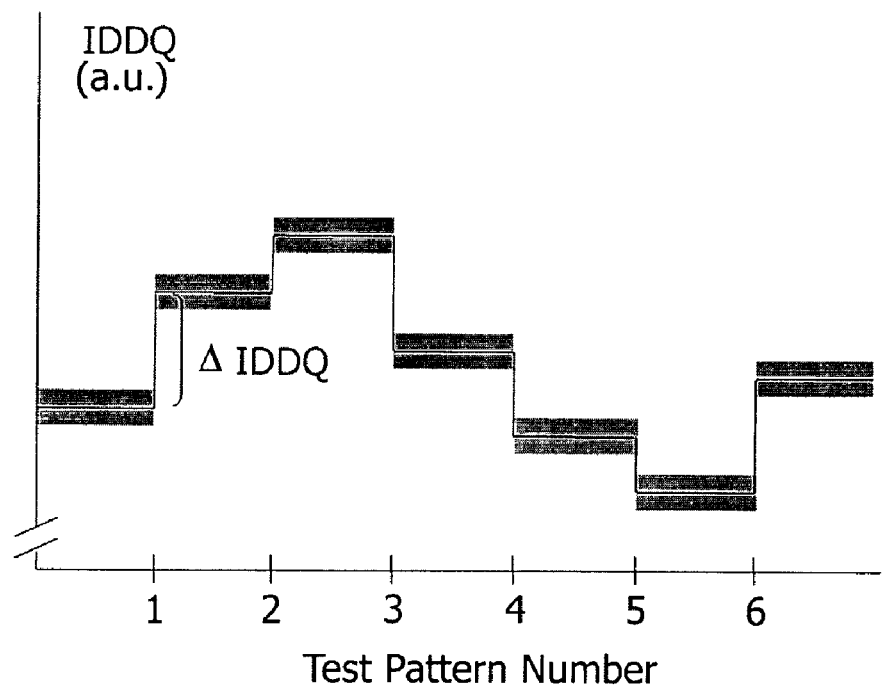
FIG. 7 shows a graph plotting the IDDQ current measured after a number of test patterns are applied to the digital inputs of the circuitry.

An improved method of IDDQ testing is the delta IDDQ method. In the delta IDDQ testing method, a number of test patterns are sent to the digital inputs of the circuitry and the IDDQ is monitored and compared (FIG. 7). The patterns are designed so that it guarantees to change the value (toggle) of every internal net. The difference between the mean value of one pattern to another is called ΔIDDQ. If any of the ΔIDDQ values departs too much from the known normal value, it can be concluded that the circuitry is defective.

For both methods, the current resolution preferably is a few µA or less; even though the current range in the delta IDDQ method can be in the mA range or even more, depending on the size of the circuitry. More information on IDDQ testing can be found in Bram Kruseman et al, The future of delta IDDQ testing, Proceedings of the Test Conference, 2001, Pages 101-110, which is incorporated herewith by reference.

Figure 8:
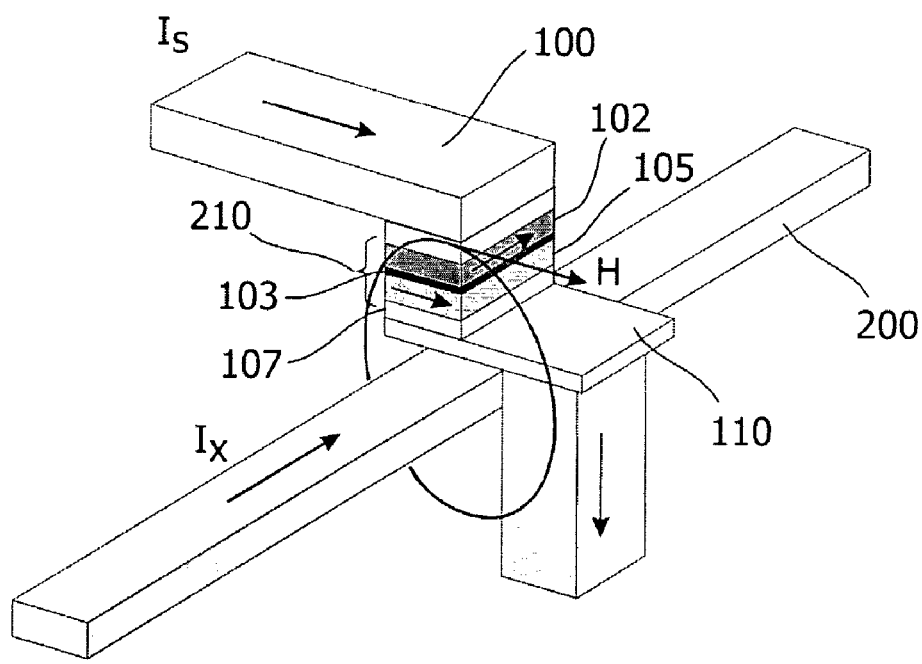
FIG. 8 shows a schematic view of a sensor according to an embodiment of the present invention.

The basic principle of a sensor according to an embodiment of the present invention is shown in FIG. 8. FIG. 8 shows that the sensor has three layers, a free magnetic layer 102, a tunneling barrier 103, and a pinned or fixed magnetic layer 105. Both the free magnetic layer 102 and the fixed magnetic layer 1OS may comprise a stack of layers. The current $I_x$ to be measured is sent through a conductor line 200, which is located underneath the MTJ sensor element 210. The sensor element 210 is galvanically isolated from the conductor 200 using a conventional isolating layer (not shown in FIG. 8). The sensor element 210 is elongated along the axis of the conductor 200, as discussed in more detail below. The sensor element 210 can be patterned in exactly the same way as MRAM cells and may be located outside the area containing the memory array. The field created by the current $I_x$ will rotate the magnetisation direction of the free layer 102 of the sensor element 210, which can be detected by its resistance change. A sense current $I_s$ is sent through the element 210 (from top to bottom) to measure the resistance.

Figure 9A:
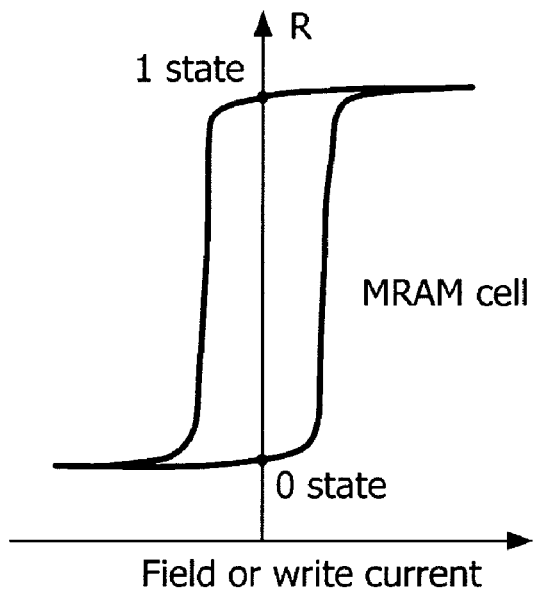
FIGS. 9A, 9B and FIGS. 10A, 10B show magneto resistance characteristics for a given prior art memory cell structure and a sensor structure according to an embodiment of the present invention, respectively.
Figure 10A:
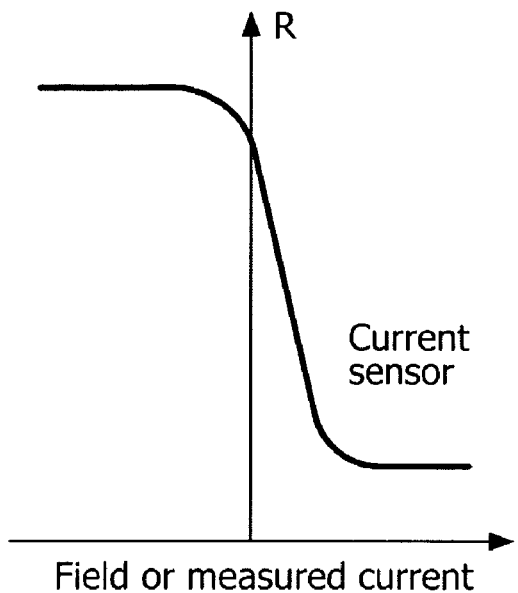
Figure 9B:
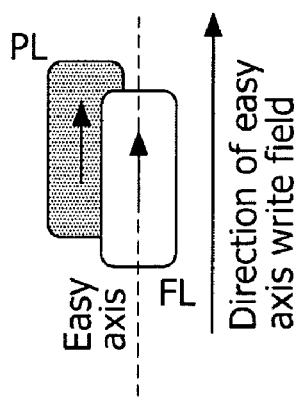
Figure 10B:
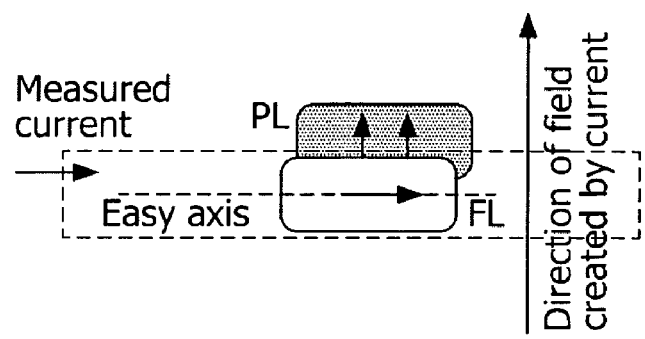

In spite of using a similar principle, MRAM cells and current sensors according to embodiments of the present invention have different characteristics, as shown in FIGS. 9A and 10A. In each case, the corresponding orientation of magnetic layers is shown in FIGS. 9B and 10B. FIG. 9A shows resistance versus magnetic field characteristics for an MRAM memory cell structure. In MRAM cells, it is desired that the magnetoresistance loop (MR loop) of the free layer be square with a relatively large coercivity (in the order of a few tens of Oe) and having two distinct remanence states. Moreover, the centre of the loop must be at zero field. In contrast, as shown in FIG. 10A, the characteristic for the current sensor is quite different. It must have on the one hand a sloping characteristic to give as large a susceptibility to magnetic field as possible (for high sensitivity) and on the other hand must have small or no hysteresis. The centre of the loop does not need to be at the zero field. Depending on applications the centre point can be chosen. For instance it can be shifted in the direction opposite to that of the measured field so that its detected range is broadened in case of measuring wide-range unidirectional current.

The geometry-dependence of the magnetic behaviours of the elements can be exploited to build the sensors with the desired characteristic. In MRAM, to obtain the mentioned hysteresis loop, the easy axis of the free layer must be parallel with the direction of the pinned magnetisation as shown in FIG. 9B. In the FIGS. 9B and 10B, the free layer and the pinned layer are shown slightly offset for the sake of clarity. In practice, the layers should be stacked on top of each other, separated by a thin isolating layer (tunneling barrier). The easy axis can be achieved by patterning the element into an elongated shape, thus causing a shape anisotropy in the elongated direction. During writing, the easy axis field, which is the essential applied field component to switch the element, is directed along the easy axis.

In sensor configuration, the easy axis of the free layer (normally in the elongated direction) should be at an angle between 0° and 180°, preferably between 45° and 135° and more preferably substantially perpendicular to the pinned magnetisation, as shown in FIG. 10B. The conductor 200 for measured current $I_x$ is preferably parallel with this easy axis, which will create a field perpendicular to the easy axis. It is well-known from the Stoner-Wohlfarth theory that the hysteresis loop of a single-domain magnetic element would have no hysteresis if it is subjected to a magnetic field directed perpendicular to its easy axis. However it is not excluded that the measured current Ix is oriented at an angle with the easy axis; even though, in most cases the parallel arrangement is the optimum choice.

Furthermore, to suppress hysteresis further, the sensor may be subjected to an additional dc magnetic field (a few Oe) created by e.g. a second current conductor in the vicinity of the device to further suppress the hysteresis. The second current is arranged so that the direction of the additional field is substantially perpendicular to the field to be measured, thus substantially parallel to the easy axis of the free layer. The additional field stabilizes the coherent rotation of the magnetisation inside the free layer, thus suppressing hysteresis caused by domain wall motions. To shift the centre point of the characteristic curve, thus shifting the measurement range of the sensor, the second current can be arranged so that the direction of the additional field is substantially parallel to the field to be measured.

Alternatively, the sensor may be subjected to an additional alternating field created by a second current conductor. The additional alternating field is used to modulate the field to be measured thus modulating the sensor signal. By using a suitable post signal processing method, the signal can be extracted, whereby signal to noise ratio can be significantly improved.

Figure 11:
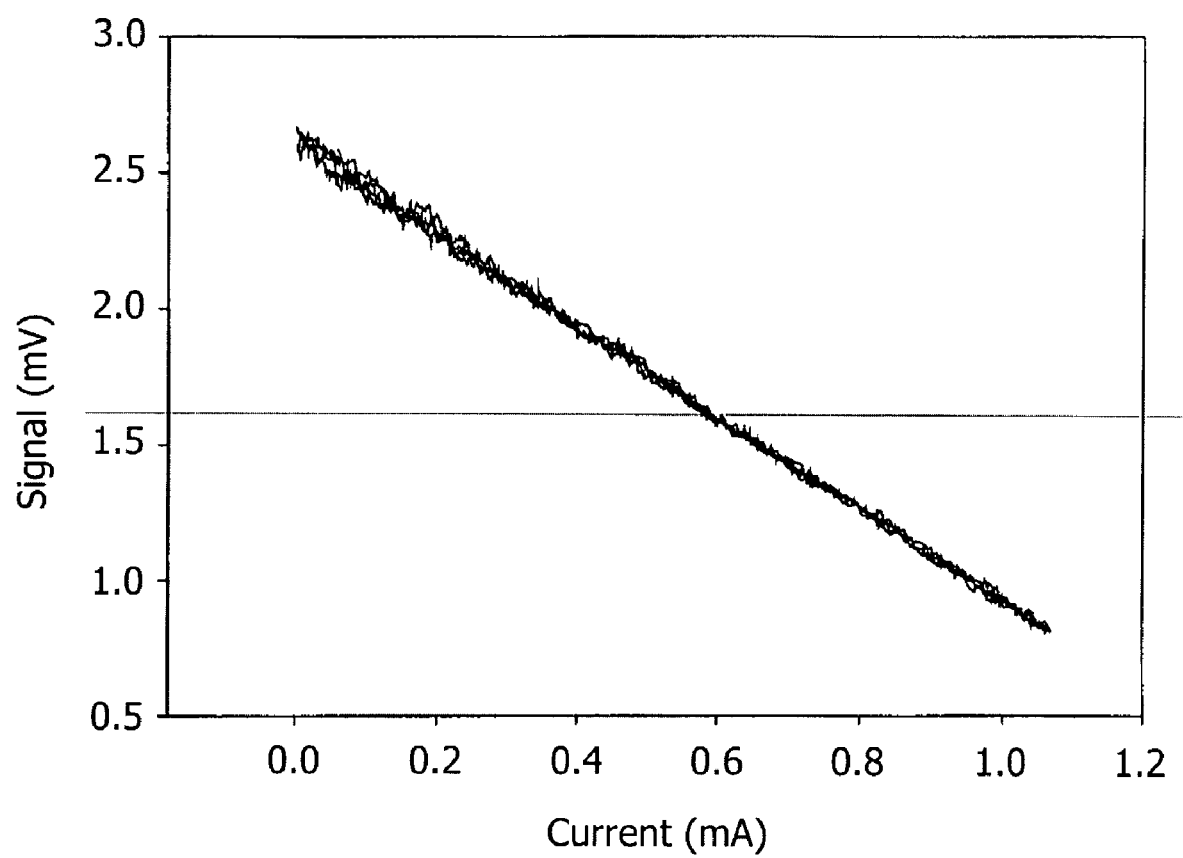
FIG. 11 shows a voltage versus current to be measured characteristic of a TMR sensor.

FIG. 11 shows a measurement of a transfer characteristic (voltage versus current) of a current sensor (Wheatstone) bridge. Each element of the sensor bridge is a TMR element with a size of 6.5×8 µm². The distance between the sensor plane to the top of the conductor 200 is 150 nm. The conductor cross-section is 6.5 µm (lateral)×0.35 µm (vertical). The voltage applied to the Wheatstone bridge is 400 mV. From the slope of the characteristic curve illustrated in FIG. 11, the sensitivity of this sensor can be derived, which is 1.7 mV/mA. For IDDx testing, the required resolution of 2 µA would result in a change of 3.4 µV. With an amplifier following conventional principles this change can easily be resolved without being swamped by noise.

The size of the sensor element 210 is more or less defined by the width of the conductor 200 which conveys the current to be measured. To have a relatively homogeneous field over the element 210, it is advisable that the width of the sensor element 210 be equal to or smaller than the width of the conductor 200. On the other hand, the width of the conductor 200 must be chosen so that it provides enough field on the sensor element 210. FIG. 12 shows the relation between the conductor width and the conductor-sensor distance with the field created at the sensor element 210. The conductor 200 has a thickness of 300 nm and the current is 10 mA. Generally speaking, the smaller the width of the conductor 200 and the shorter the conductor 200—sensor element 210 distance, the larger is the field that can be created at the sensor element 210. For instance, if a measurement of a few mA range or smaller is required, the width of the conductor 200 should not be larger than about 2 µm to get enough field to drive the sensor element 210. The thickness of the conductor 200 is taken to be about 300 nm and the distance between the conductor 200 and the sensor plane is about 150 nm, which are realistic practical values. Therefore since the width of the sensor element 210 should not be larger than that of the conductor 200, the sensor width should also be less than 2 µm.

The length of the sensor element 210 depends on the requirement of sensitivity and hysteresis. The smaller the aspect ratio, the larger is the sensitivity that can be obtained. Ideally the sensor shape can be round to get the maximum sensitivity. However, sensitivity is a counter factor of hysteresis: the smaller the aspect ratio, the larger the hysteresis becomes. To reduce hysteresis, it is necessary to induce some anisotropy along the conductor direction to stabilise the magnetic moments. The easiest way is to elongate the element to make use of the so-called "shape anisotropy". In practice, a compromised value of the aspect ratio is found to be about 5-7 (valid for elements having a width of about 1 to a few microns) to have a relatively high sensitivity without remarkable hysteresis.

The pinned (or hard reference) layer of the sensor element may consist of a single ferromagnetic layer having a net magnetization or it may consist of an artificial anti-ferromagnetic (AAF) stack having a substantially zero net magnetization. The AAF stack typically consists of two ferromagnetic layers (e.g. CoFe) which are antiferromagnetically coupled through the non-magnetic layer (e.g. Ru). This stack is in fact equivalent to a single pinned layer but more robust due to the strong antiferromagnetic interaction of the layers. Furthermore, it is to be noted that more advanced layered structures can be used for the free layer, in accordance to the material systems that have been introduced to improve the scalability of MRAM towards smaller CMOS nodes, such as magnetostatically coupled structures, and antiferromagnetically coupled AAF structures.

FIG. 13 shows the magnetization orientations of the AAF stack as the pinned (hard reference) layer and of the free (soft storage) layer in the memory cell, and FIG. 14 shows the magnetization orientations of the corresponding layers for the sensor. In these figures, the insulating tunnel barrier layer and the non-magnetic interlayer of the AAF stack are not shown for the sake of simplicity. FIGS. 12 and 14 show how the shape anisotropy, in other words elongation, is orthogonal to the externally applied field $H_{extern}$ for the sensor, yet is parallel for the prior art memory cell. This also produces the slope of the transfer curve. In FIG. 14, a crossed-anisotropy configuration is achieved in the sensor design, which allows a stable magnetisation configuration (approximately at zero magnetic field) in which the magnetisation of soft and reference layers are orthogonal to one another.

Figure 15:
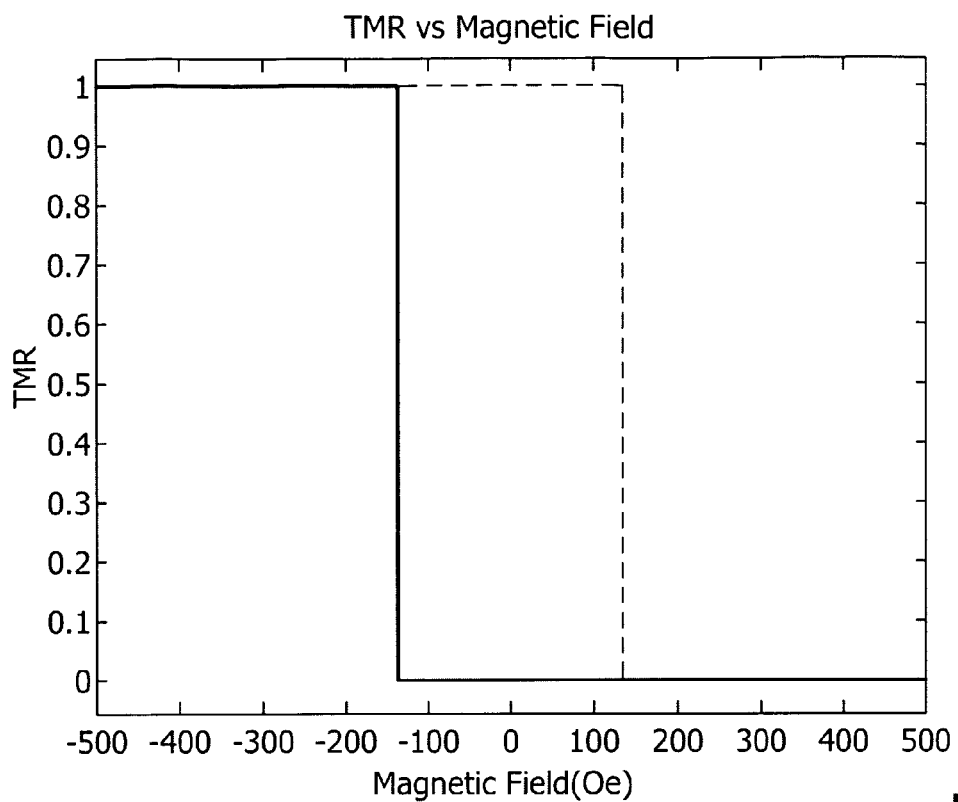
FIGS. 15 to 18 show graphs of calculated resistance of a TMR element against magnetic field strength in different situations.

Some examples of calculated characteristics for sensor elements having structure as in FIG. 14 are shown in the graphs of FIGS. 15 to 18. Graphs illustrating resistance versus magnetic field strength are shown. FIG. 15 shows resistance versus magnetic field strength for a memory cell for reference purposes. It can be seen that sensitivity near zero field is low, and that there is hysteresis. This example used layers in a rectangular shape of 180×120 nm². The MRAM has a reference stack of CoFe—Ru—CoFe in which the thicknesses of the two CoFe layers are 1.75- and 2.25 nm, respectively, and a free layer of NiFe of 5 nm.

Figure 16:
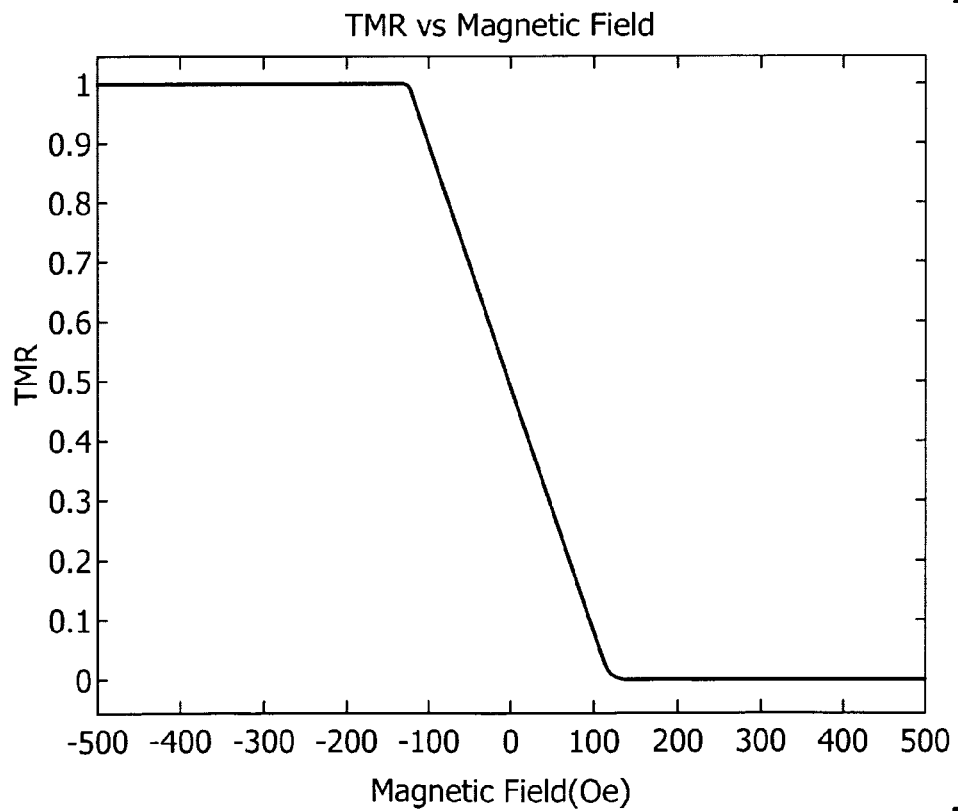

FIG. 16 illustrates the graph of resistance versus magnetic field strength for a first sensor device which is composed as the memory cell described above with respect to FIG. 15, and has dimensions 120×180 nm². In the sensor configuration, the magnetic layers CoFe of the reference stack are pinned to the direction which is orthogonal to the easy axis of the free layer and the field is applied in the direction of the pinning direction.

For an ellipse, the shape anisotropy is given by an anisotropy field $$H_k = 4\pi(t.M)(\eta_y - \eta_x)/w,$$

with (t.M) the product of free layer thickness and saturation magnetisation, and ($\eta_y - \eta_x$) a monotonously increasing function of the aspect ratio 1/w with value 0 for 1/w=1 (circular) and 1 for 1/w=∞. For the numbers as given below, $H_k$=160 Oe. The sensor sensitivity is then related to the signal. As an example, take a magnetic tunnel junction with e.g. 40% usable TMR signal. The estimated sensitivity is then:

$$\text{Sensitivity} = TMR[\%]/(2.H_k)$$

For the example as given, there is a sensitivity of 0.125%/Oe. Note that this sensitivity can be improved by increasing the width w of the sensor. An effective magnetic field sensitivity can be deduced from the voltage signal that is retrieved. For a bias of approximately 200 mV, a 40% TMR signal leads to ΔV=80 mV, from which the sensitivity is calculated to be 250 μV/Oe before amplification. As in MRAM memory cell designs, a voltage-clamping transistor can be added, to fix the voltage $V_{bias}$ over the sensor element, and the resulting current variation $i_{sense}$ can be amplified. For a magnetic tunnel junction of 10 kOhm, the maximum current variation would be 8.3 μA, and with e.g. $R_{load}$=50 kOhm, then ΔV=415 mV.

Figure 17:
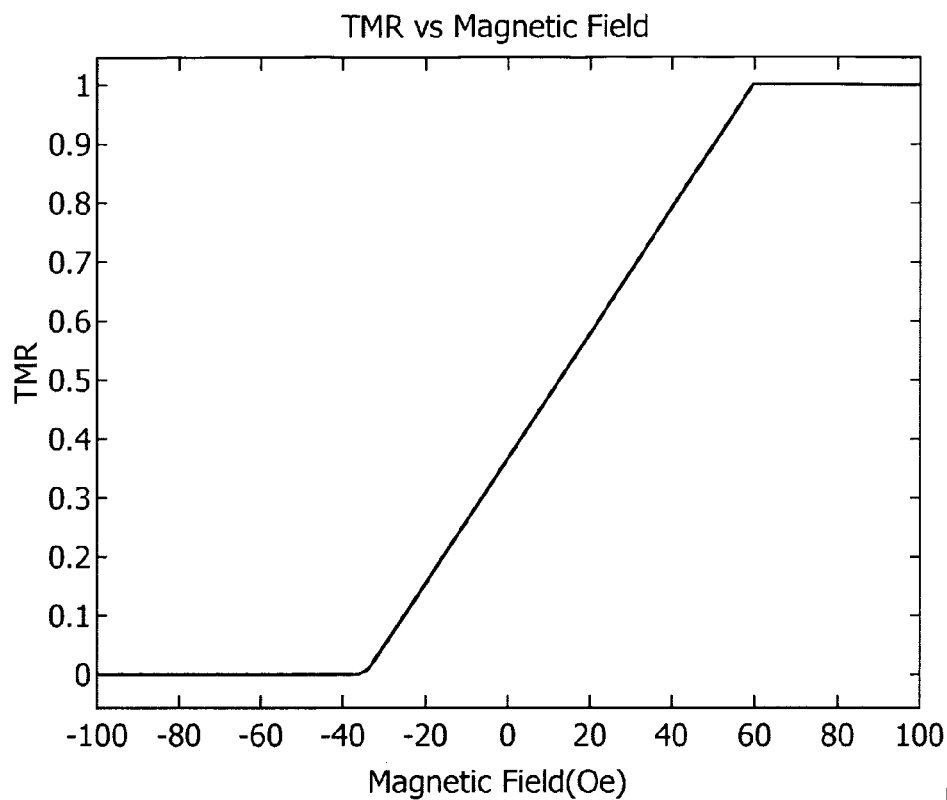
Figure 18:
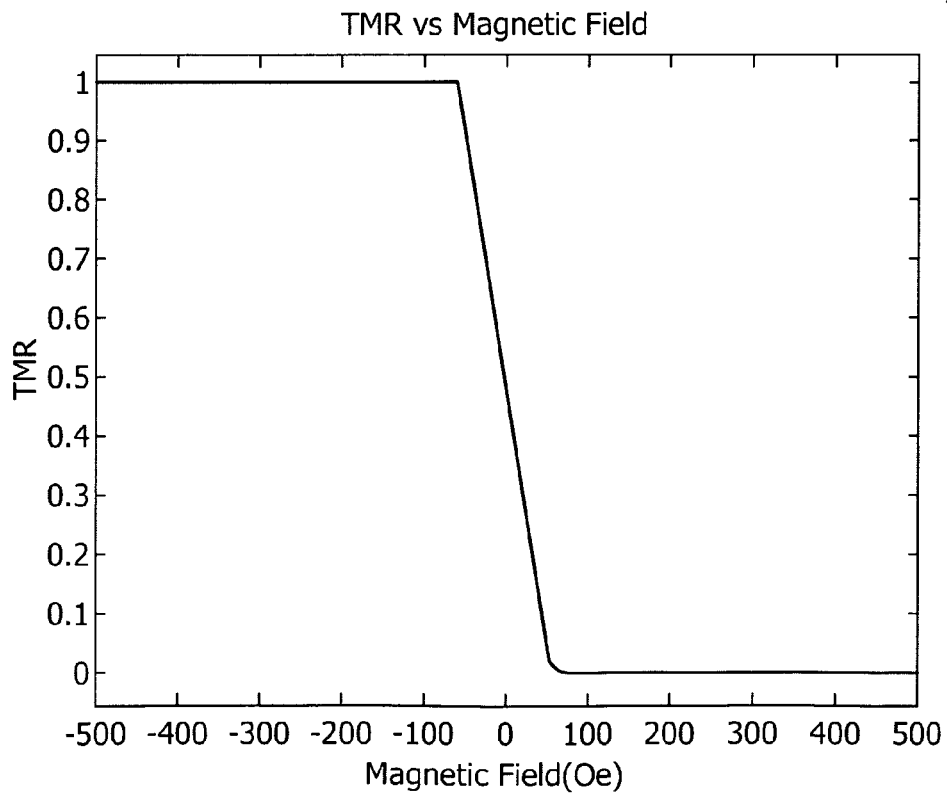

FIG. 17 illustrates the graph of resistance versus magnetic field for a second sensor device. The device has dimensions of 700×5000 nm². The device has a reference stack of CoFe—Ru—CoFe of 2.0-2.5 nm, and a soft layer of NiFe of 5 nm. Assuming that the full MR ratio is 40%, it can be calculated that the sensitivity of the sensor is 0.4%/Oe.

In a last step, the magnetic field generation of a current line can be considered. This problem heavily depends on the geometry as shown in FIG. 12. A typical value in MRAM designs is a few Oe magnetic field generation per mA current. Suppose a field generation of 5 Oe per mA. With the previous findings, this would lead to an effective current sensitivity of approximately 6.5 mV/mA. For the example as given in FIG. 18, using a rectangular sensor of 240×360 nm², where $H_k$=50 Oe, there would be a current sensitivity of about 21 mV/mA, using the same assumptions.

In conclusion, from both experiment and theoretical considerations, it is possible to yield signals in the range of a few to a few tens of mV per mA, which would be about two orders of magnitude better than for current MAGFET devices as described in Walker et al, "A Practical Built-in Current Sensor for IDDQ Testing", ITC2001, paper 14.3; or in Giovanni Busatto et al, Microelectronics Reliability 43 (2003) 577-583. In other words, current variation in the μA level would lead to a change in signal in the μV to tens of μV range.

According to further embodiments of the present invention the integrated circuit arrangement comprising the above current sensing device may be provided with special measures to enhance the sensitivity of the current sensing device or the generation of the field to be measured.

According to an embodiment of the present invention, means may be provided for generating a stronger field at the sensor level with a same current being conveyed by a current conductor. Such means may for example be to use at least one vertical conduction component, such as e.g. a via, together with at least one horizontal conduction component, such as e.g. an interconnect line. The vertical conduction components and the horizontal conduction components are connected so as to form an L-shaped conductor structure, or so as to include at least an L-shaped conductor portion of which the corner is located adjacent the current sensing device.

Examples of how to obtain this are given hereinafter.

Figure 19:
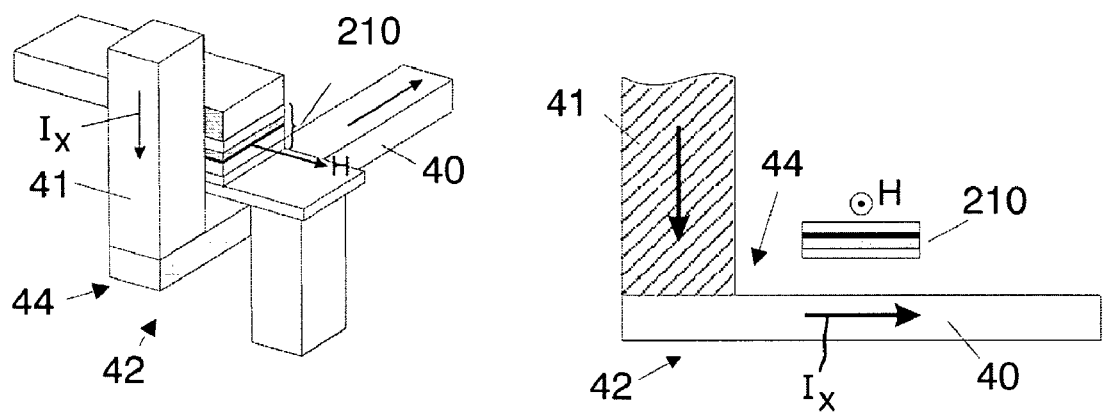
FIG. 19 is a perspective view (left hand side) and a side view (right hand side) of a circuit arrangement comprising a current sensing device located in the corner of an L-shaped current conductor, according to an embodiment of the present invention.

As a first example, a horizontal interconnect line 40 is connected to a vertical via 41, thus forming an L-shaped structure 42 (FIG. 19). The left hand side of FIG. 19 shows a perspective view and the right hand side of FIG. 19 shows a vertical cross-sectional view. This L-shaped structure 42 is used as the conduction path for a current $I_x$ to be measured. The current sensing device 210 is located near the corner 44 of the L-shaped structure 42. Because, when current flows through the L-shaped structure 42, both the via 41 and the horizontal interconnect line 40 create a magnetic field in the same direction at the position of the current sensing device 210 according to the right-hand rule, the resultant magnetic field measured at the current sensing device 210 is approximately doubled with respect to that in the conventional design with only a straight horizontal conductor. It is desired that the vertical conduction component, via 41, be located as close as possible to the current sensing device 210, depending on the available patterning technology. The upper end of the via 41 can be connected to any upper interconnect level which further links to the current path under measurement.

Figure 20:
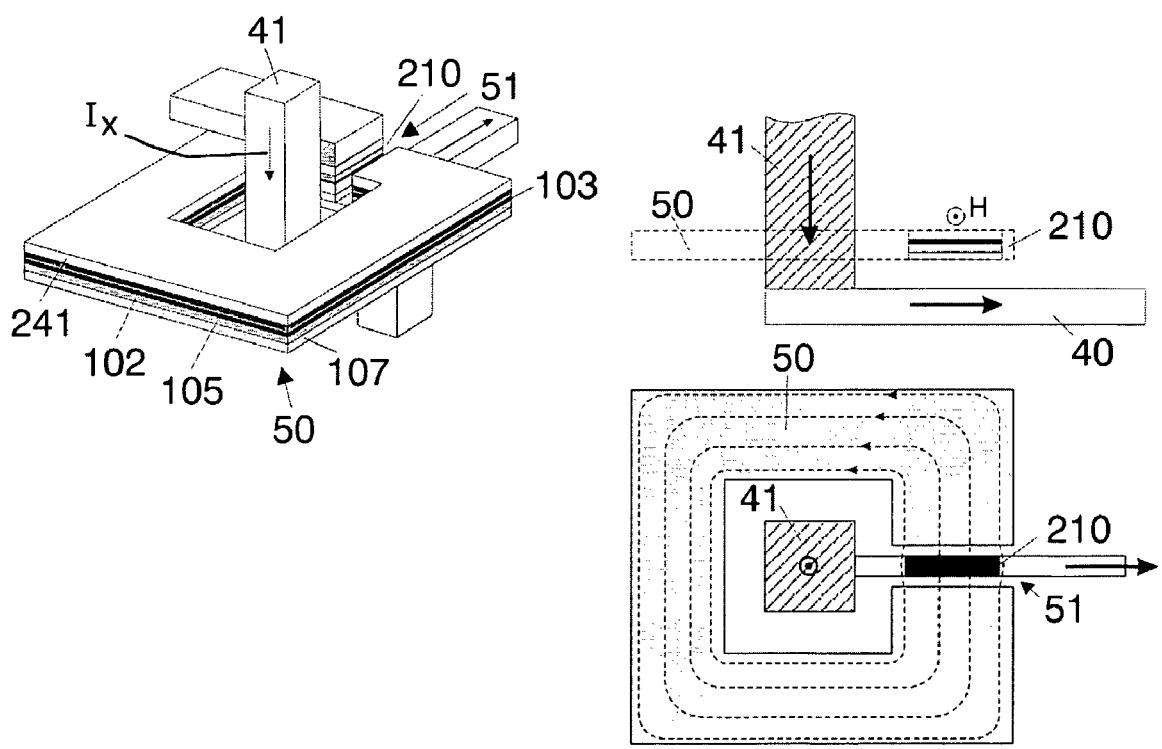
FIG. 20 is a perspective view (top left hand side), a cross sectional view (top right hand side), and a top view (bottom right hand side) of the embodiment as in FIG. 19, but furthermore provided with flux-concentrating means, according to a further embodiment of the present invention.

As a second example, a ring-shaped flux-concentrator 50 is added to the design of the first example, as illustrated in FIG. 20. The ring-shaped flux-concentrator 50 presents a gap 51, and the current sensing device 210 is located in the open gap 51 of the ring-shaped flux-concentrator 50.

The flux-concentrator 50 may be a dummy MTJ, for example patterned around the via 41. The free layer of the ring-shaped dummy MTJ arranged in the neighbourhood of the current sensing device can be used as a flux guide to concentrate more flux into the current sensing device, thus making the detection limit lower. The ring-shaped flux-concentrator 50 concentrates the circular flux lines created around the vertical via 41 into the gap 51 of the ring where the sensing device 210 is located. In addition, the area of the flux-concentrator 50 near the gap 51 also partly concentrates flux lines created by the horizontal conductor line 40. Using the flux-concentrator 50, the flux density, thus magnetic field strength at the sensing device 210 can drastically be increased. The distance between the edges of the sensing device 210 and the "poles" of the gap 51 should be as small as possible, depending on the capability of the technology.

At the top left hand side of FIG. 20, a perspective view of the L-shaped structure 42 provided with a flux-concentrator 50 is shown. The layers of the flux-concentrator 50 correspond to those of the sensing device 210 and thus, according to the present invention, also to the layers of integrated MRAM cells. There is a sensing (free) layer 102, an insulating layer (tunnel barrier 103), a pinned magnetic layer 105 and an anti-ferromagnetic layer 107 used to pin the magnetisation of the pinned layer to a fixed direction (exchange-bias direction). In the example shown in FIG. 20, there is also a capping layer 241. For simplicity, only those layers are shown in the MTJ stack. In practice there may be more layers, which are not relevant here to the principle of operation. The free layer (sensing layer 102) of the flux-concentrator 50 can act as a flux guide for the sensing device 210 that is placed in the gap 51 of the flux-concentrator 50 because its magnetisation is free to rotate. The pinned layer 105 of the flux-concentrator 50 will not influence the flux change during the measurement because its magnetisation is fixed.

The present design allows the flux-concentrator 50 for the sensing device 210 to be created without any extra processing steps, which suits applications such as integration into MRAM chips.

At the top right hand side of FIG. 20, a cross-section is shown of the structure illustrated at the top left hand side of FIG. 20.

The bottom right hand side of FIG. 20 shows a top view of the L-shaped structure 42 with flux-concentrator 50. It is preferred that the flux-concentrator 50 has a width larger than the sensing device 210 for better efficiency and homogeneous field produced in the gap 51. The permeability of the flux-concentrator 50 can be tuned by varying its geometry. The aspect ratio of the flux-concentrator 50 should be chosen such that it is not fully saturated in the field range to be measured but still has sufficiently large permeability for concentrating the flux. The flux-concentrator 50 should be patterned as close as possible to the sensing device 210, but still electrically isolated from it. The closer it is, the more efficient is the flux guiding. Of course the minimum spacing depends on the lithography resolution and the etching technique used.

Figure 21:
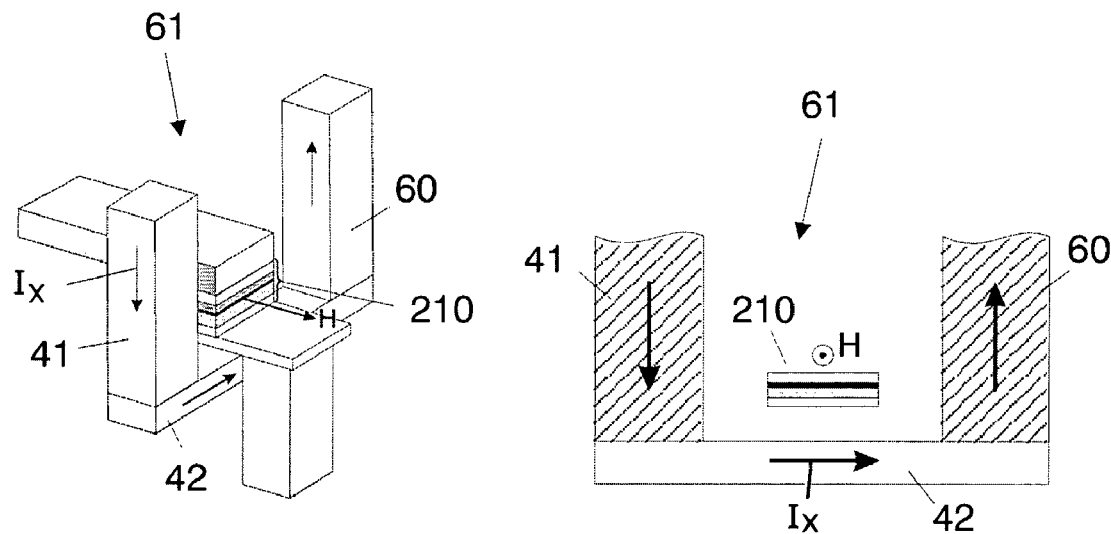
FIG. 21 is a perspective view (left hand side) and a side view (right hand side) of a circuit arrangement comprising a current sensing device located in the centre of a U-shaped current conductor, according to yet another embodiment of the present invention.

As a third example, illustrated in FIG. 21, a second via 60 is added to the design of the first example to form a U-shaped structure 61. The U-shaped conduction path wraps around the sensing device 210, partly forming a loop. With this U-shaped structure 61, the field created at the sensing device 210 is approximately tripled for a same current $I_x$ to be measured, compared to the conventional case with only a straight conductor. The sensing device 210 is preferably located at the centre of this U-shaped structure 61, preferably equally spaced from the three segments 41, 42, 60 of the U-shaped structure 61. The upper ends of the vias 41, 61 are connected to any upper interconnect levels (not represented in the drawings) which will further link up with the current path under measurement.

Figure 22:
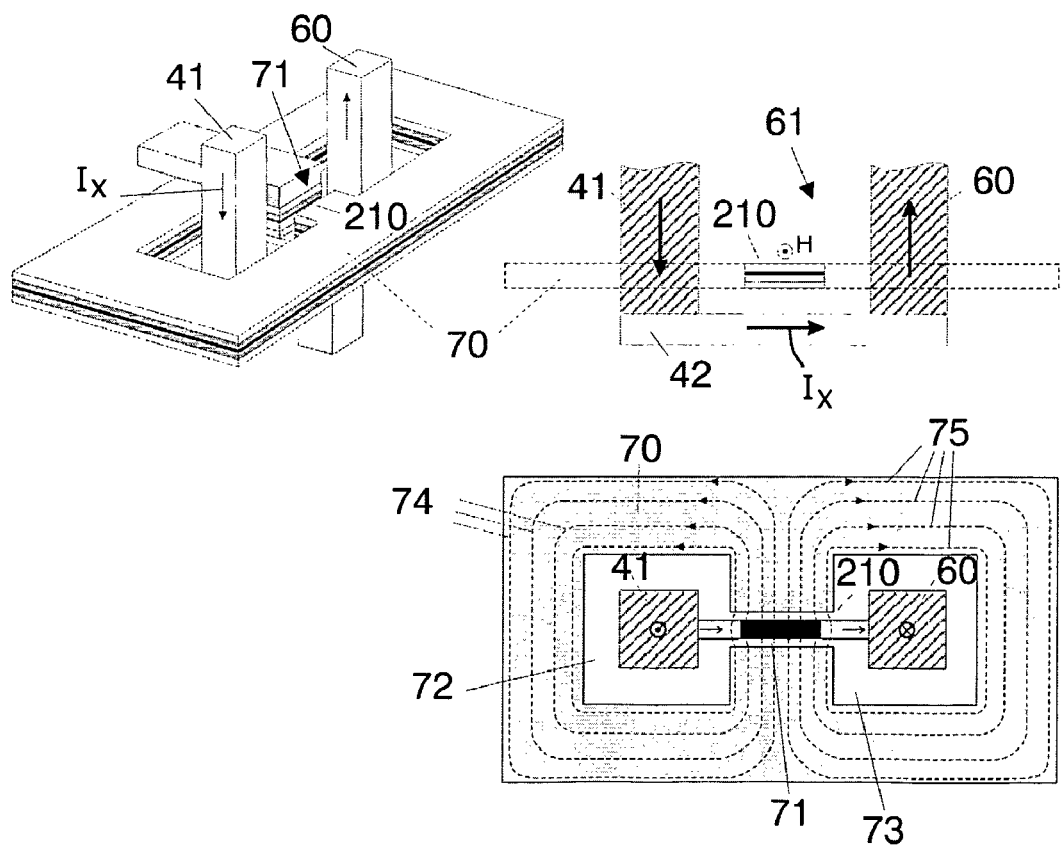
FIG. 22 is a perspective view (top left hand side), a side view (top right hand side), and a top view (bottom right hand side) of the embodiment as in FIG. 21, but furthermore provided with flux-concentrating means, according to yet a further embodiment of the present invention.

As a fourth example, illustrated in FIG. 22, a double-ring flux-concentrator 70 made from a dummy MTJ is added around the two vertical vias 41, 60 of the third example. The sensing device 210 is placed in the gap 71 of the flux-concentrator 70. The conduction path, consisting of via 41, horizontal line 42 underneath the sensing device 210 and via 60, is threaded through the two holes of the double-ring flux-concentrator 72, 73. When a current $I_x$ is sent through the U-shaped conduction path 61, from e.g. via 41 to via 60, it creates two groups of circular flux lines 74, 75 on the plane of the sensing device 210, which are concentrated by the flux-concentrator 70: one group of flux lines 74 circulating counter-clockwise with regard to via 41, and another group of flux lines 75 circulating clockwise with regard to via 60. They both have the same direction at the gap 71, thus the flux-density at the sensing device 210 is doubled in strength, compared to the second example given. This is the best example among the four, in terms of sensitivity and low field detection limit, because with a same current $I_x$ sent through the conduction path, this example gives the strongest field at the sensor position. Even though the design is more complicated, it does not require any extra processing steps; only the design of the mask has to be changed.

In an alternative embodiment it is possible to replace the dummy MTJ type of flux-concentrator 50, 70 by a dedicated flux-concentrator made from a soft magnetic layer, which is patterned separately from the MTJ stack. In this case, it requires extra processing steps. However, in return, the efficiency of the flux-concentrator may be better. This is because the most efficient flux concentrator has been proved to have a thickness of at least 10 nm, whereas the free layer of the MTJ has a thickness of only around 4-5 nm, though at this thickness, it starts to have the effect.

The sensor in the different embodiments can be read using detection circuitry that is measuring the resistance of the device. Examples of such detection circuitry are discussed below.

In addition, a nulling-mode feedback mode may be applied. In such a system, an opposite magnetic field is generated at the location of the magnetic field sensor, with a magnitude that is varying in time, and such that the total local field measured by the sensor is forced to zero. The electrical feedback signal itself can be the direct output signal of the sensor module. Nulling has the advantage that the sensor working point is fixed, typically at, but not limited to, zero magnetic field. As a consequence, the measuring range of the current sensor can be extended, and its linearity improved. Furthermore, hysteresis effects can be suppressed. Nulling can be implemented for a current sensor designed using the conventional MRAM concept as well as for current sensors sharing the same balanced AAF free stack with toggle type MRAM cells.

In a further embodiment, a different nulling concept for current sensors that share the same MTJ stack with the toggle MRAM cells is introduced. The principle behind this embodiment is presented in FIG. 23. A sensing device 210 (i.e. an MTJ element) is placed in between a first conductor line 90 and a second conductor line 91: one below and one above the sensing device 210. The MTJ element is galvanically isolated from the two conductor lines 90, 91. The two lines 90, 91 are arranged symmetrically with respect to the easy axis of the sensing device 210, i.e. each of them forms a same angle a with the easy axis of the sensing device 210. The angle a may have any value between 300 and 90°, preferably is 45° or 90° for current CMOS design rule compatibility. The first conductor line 90, for example a conductor line physically located beneath the sensing device 210, is used for the current to be measured ($I_x$) and the second conductor line 91, for example a conductor line physically located above the sensing device 210, is used for a counter current ($I_2$). However, in alternative embodiments, the arrangement of the conductor lines 90, 91 can be up-side-down, that means the upper conductor line can be used for conveying current $I_x$ to be measured and the lower conductor line can be used for conveying the counter current $I_2$.

Figure 24:
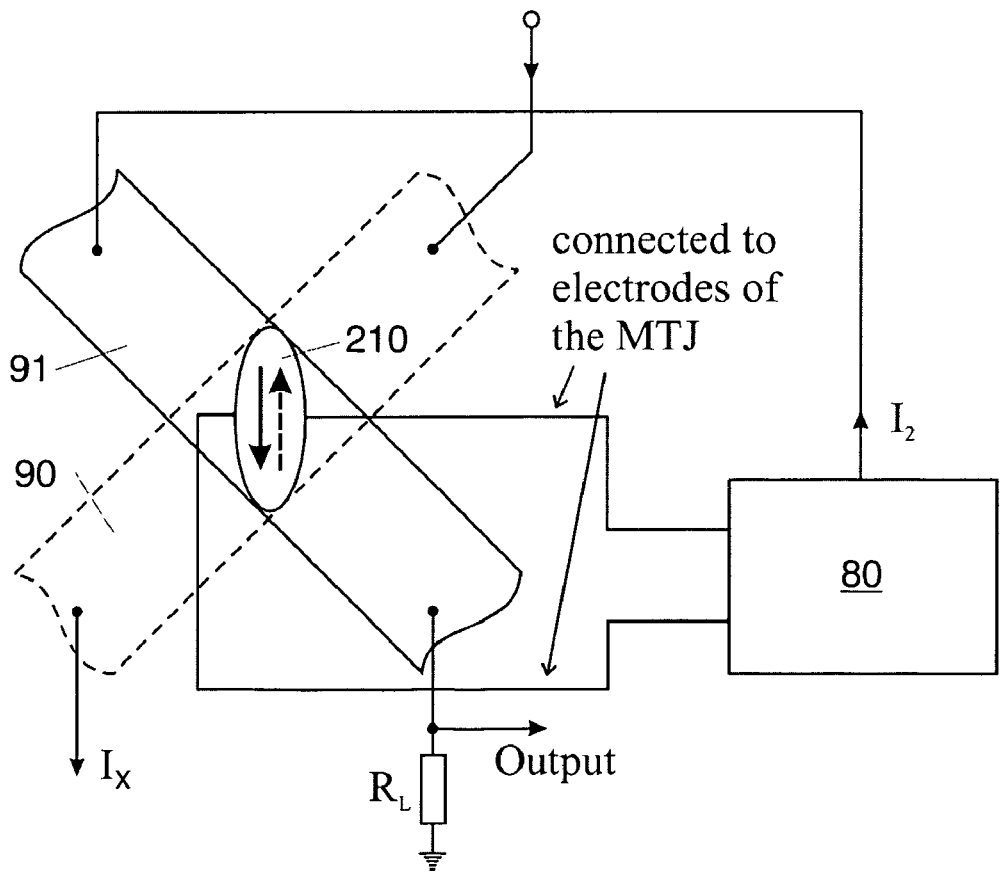
FIG. 24 is a circuit block diagram of an embodiment of the present invention including a feedback circuit.

The top and bottom electrodes (not represented in the drawings) of the sensing device 210 are electrically isolated from the two conductor lines 90, 91 and are connected to a feedback circuit 80 (as illustrated in FIG. 24). The feedback circuit 80 drives a counter current $I_2$ in the second conductor line 91.

Figure 23:
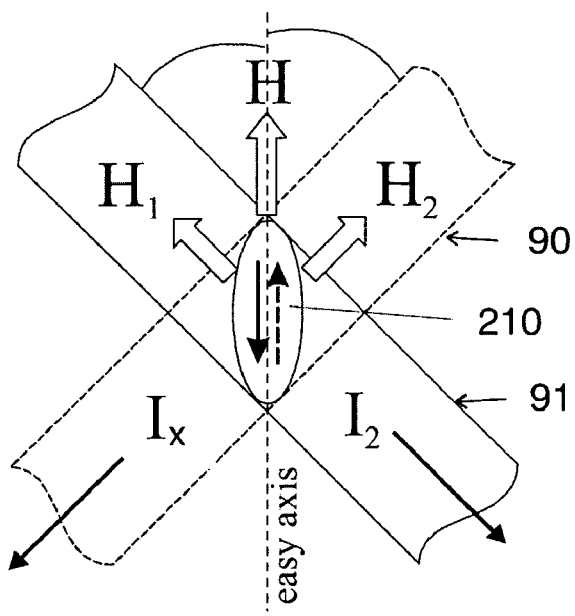
FIG. 23 illustrates a top view of a current sensing device according to the present invention with crossing first and second conductive lines.

During measurement, current $I_x$ creates a first magnetic field $H_1$ on the sensing device 210, which tends to rotate the AAF magnetization pair in the free stack 220 clockwise while current $I_2$ induces a second magnetic field $H_2$, which tries to rotate the magnetization pair in the free stack 220 counter-clockwise (see FIG. 23). If the first and the second magnetic fields are equal, $H_1=H_2$, or in other words, the resultant field H is oriented in the easy axis direction, and if the magnitude of the resultant field H does not exceed the spin-flop field in the easy axis direction, the magnetization pair of the free stack 220 will not rotate, thus no MR change is observed at the feedback circuit 80. The spin-flop field $H_{flop}$ is a function of the uniaxial anisotropy field $H_k$ and the saturation field $H_{sat}$ of the artificial antiferromagnet, i.e. $H_{flop}=\mathrm{sqrt}(H_k*H_{sat})$. Details about the spin-flop field can be found in US2004/0120184. To avoid the resultant field H to exceed the spin-flop field, the angle α between each of the conductor lines 90, 91 and the easy axis should be chosen correctly, depending on the measured current range, i.e. the following condition must be satisfied: $\cos \alpha < H_{flop}/(2*H_1)$. The feedback circuit 80 is designed in such a way that it tries to balance the first and second magnetic fields $H_1$, $H_2$, by reading the output signal of the sensing device 210. In other words, the feedback circuit 80 tries to drive the current 12 in the second conductor line 91 so that the MR change of the sensing device 210 remains zero. The voltage drop on a load resistor $R_L$ connected in series with the second conductor line 91 is thus proportional to the current 12 flowing through the second conductor line 91 and consequently to the current $I_s$ to be measured and flowing through the first conductor line 90, and can be used as the output of the sensing device 210. Any other ways of extracting an output from the feedback circuit 80 are also possible.

Figure 25:
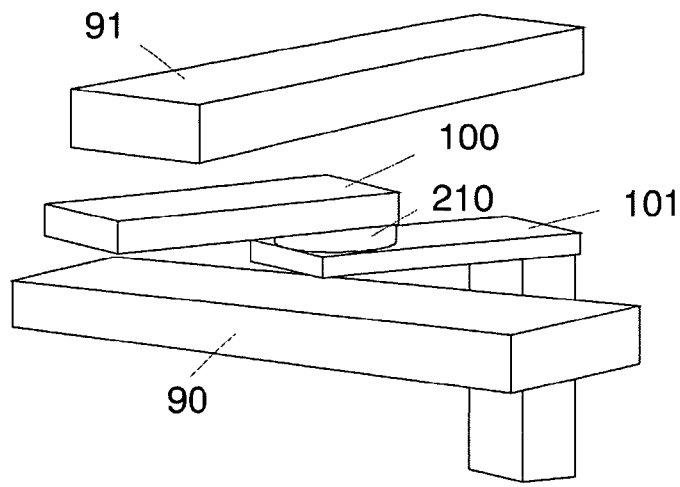
FIG. 25 is a perspective view of the current sensing device as in FIG. 23.

A perspective view of the design according to this embodiment is shown on FIG. 25.

The proposed embodiment offers the following advantages:

Larger measuring range, because the range is not limited by the rotation of the magnetization pair.

Linear characteristic within the range of measurement. This is because within the measuring range, the output is proportional to $I_2$, which is again purely proportional to $I_x$.

No hysteresis, because the magnetization does not significantly rotate.

No change in processing steps, thus no extra cost.

Figure 26:
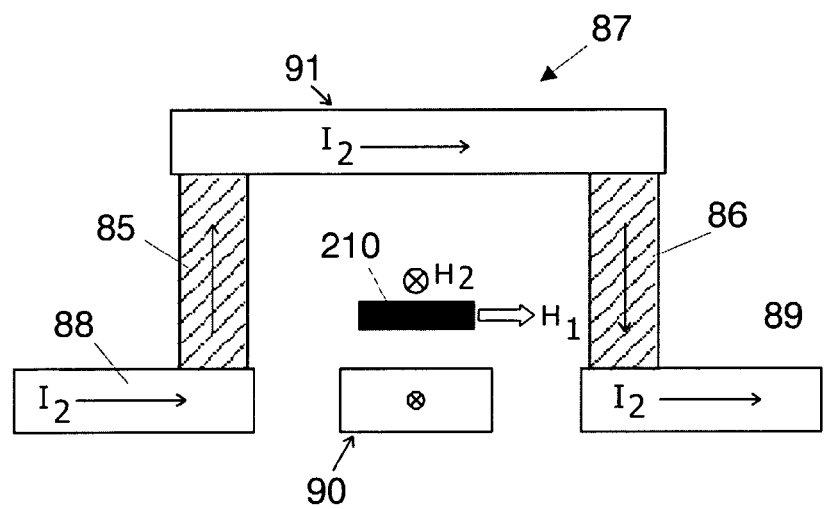
FIG. 26 is a side view of an integrated circuit arrangement according to an embodiment of the present invention. The electrodes of the sensing device are not shown for the simplicity of the drawing.

Another embodiment of a design according to the present invention is proposed in FIG. 26. The upper conductor line 91 is connected to two vertical vias 85, 86 that are closely located near to the sensing device 210, forming a U-shaped bridge 87. $I_2$ enters the bridge 87 from a conductor 88 in a lower metal layer, for example from the same layer as the lower conductor line 90, and it leaves the bridge 87 at a conductor 89 in the same metal layer or a different one. The magnetic field created by the three segments 85, 91, 86 of the U-shaped bridge 87 are added up at the position of the sensing device 210 and result in approximately three times larger field compared to the design of FIG. 25, with a same current $I_2$. Therefore in this case, in order to obtain $H_2=H_1$, the required value of $I_2$ is even smaller than the current $I_x$ to be measured.

Figure 27:
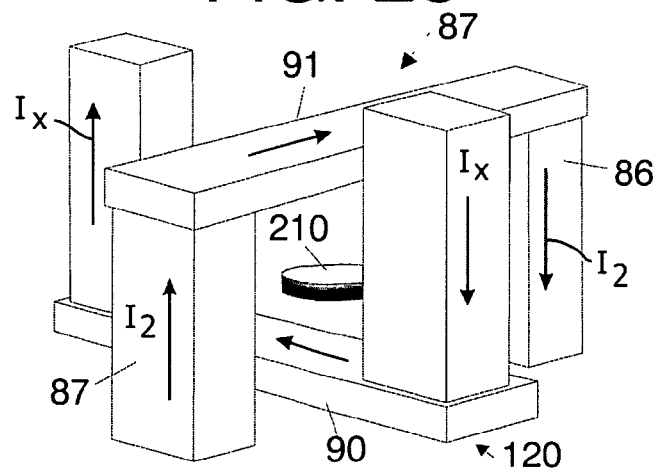
FIG. 27 is a perspective view of an integrated circuit arrangement according to a further embodiment of the present invention.

A further embodiment is shown in FIG. 27, where both upper line 91 and lower line 90 are structured in the form of a U-shaped bridge 87, 120. The sensitivity and low current detection limit in this case are still further improved.

To obtain more sensitive current sensors from the toggle MRAM stack, according to an embodiment of the present invention the as-deposited toggle type MTJ stack is locally modified on the areas that contain the sensors, in such a way that the net magnetic moment of the free layer in fact becomes non-zero as in conventional MTJ stack sensors. A conventional MRAM stack suitable for sensor applications can thus be locally recovered from the toggle MRAM stack.

Locally modifying areas that contain the sensors, in such a way that the net magnetic moment of the free layer becomes non-zero can be done, according to an embodiment of the present invention, by decreasing or increasing the magnetic moment of one of the magnetic layers in the AAF free stack.

Figure 28:
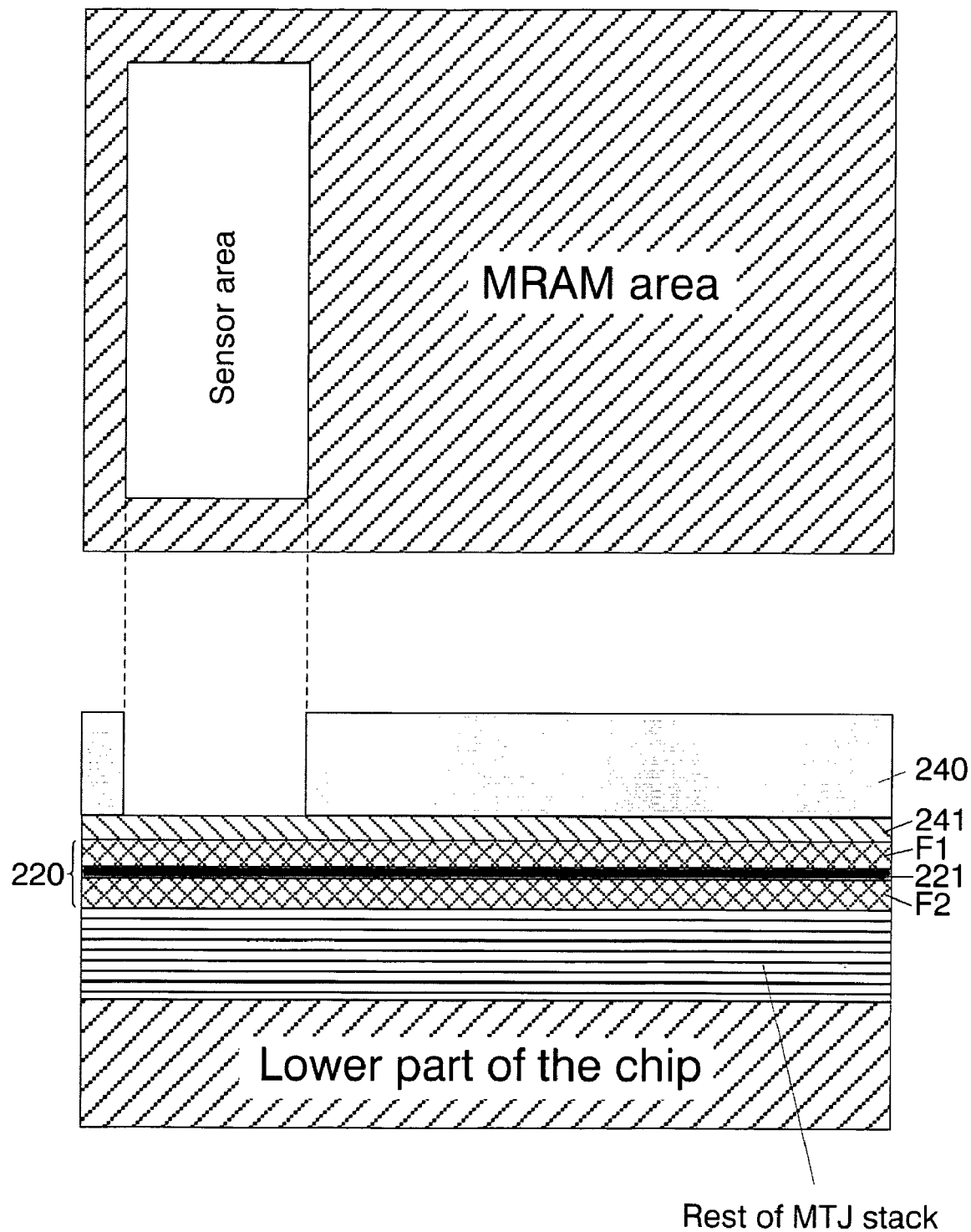
FIG. 28 illustrates in top view (top part of the drawing) and cross-sectional view (bottom part of the drawing) masking of areas of an MTJ stack that will not contain sensors, the masking being performed by a photoresist layer by means of a lithography step.

Directly after deposition of the MTJ stack, a lithography step is carried out to mask the areas that do not contain the sensors, as illustrated in FIG. 28, and therefore will not be modified. The masked areas may contain MRAM cells that will be patterned in the later process steps.

The top part of FIG. 28 shows a top view and the bottom part of FIG. 28 shows a vertical cross-sectional view of a toggle type MTJ stack after deposition of the masking material and before any further structuring steps. The stack is then ready for modification so as to decrease or increase the magnetic moment of one of the magnetic layers in the AAF free stack 220. After the modification of the MTJ stack, the masking material, e.g. the photoresist 240, is removed.

Examples of how to decrease or increase the magnetic moment of one of the magnetic layers $F_1$, $F_2$ in the AAF free stack 220 are given hereinafter.

As a first example, at least the top ferromagnetic layer $F_1$ of the AAF free stack 220 can be partially or totally removed in any suitable way. The most preferred method for removal is an etching technique, for instance ion beam etching, reactive ion beam etching, sputter etching, plasma etching, wet etching, etc.

The capping layer 241, e.g. of Ta, has to be etched first. Subsequently the upper magnetic layer F1 is at least partially removed. Ideally, etching should stop on top or within the interlayer 221, as illustrated in the top part of FIG. 29. This will guarantee the highest sensitivity of the sensor. However, F1 can also be removed partially, which is enough to unbalance the AAF. If the free stack comprises more than two magnetic layers, one or more layers may be at least partially removed so as to obtain a structure where the net magnetic moment no longer equals zero.

Figure 29:
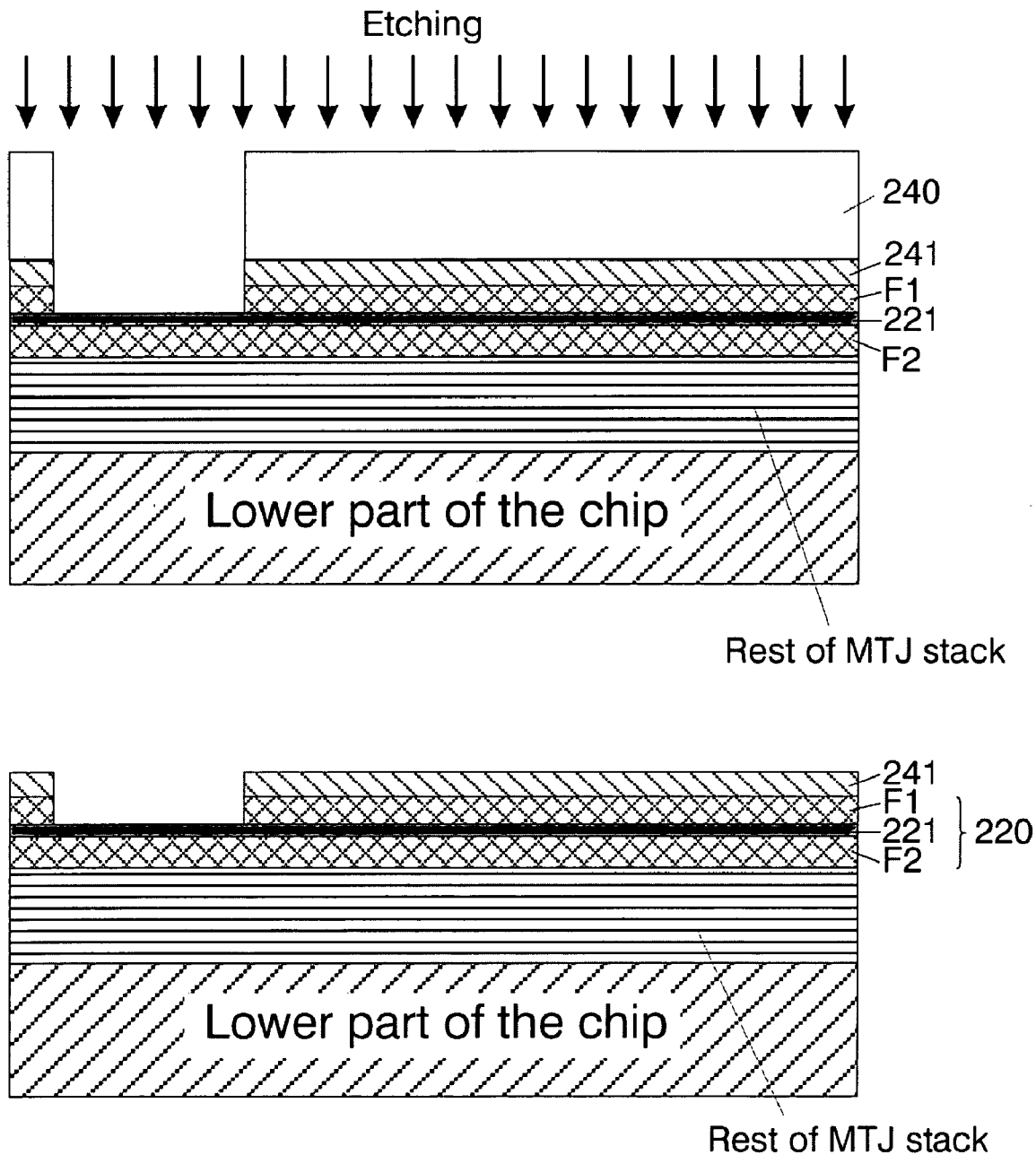
FIG. 29 illustrates removal of a magnetic layer of the AAF stack by means of etching according to an embodiment of the present invention.

Finally the masking layer, e.g. the photoresist 240, can be removed after etching, as illustrated in the bottom part of FIG. 29. The standard part, i.e. all remaining steps needed for patterning the MRAM cells (and automatically therewith the sensors) and conductor lines until the complete manufacturing of the chip is finished, of the MRAM process can be done as normal after these extra steps.

As a second example, the magnetic property of the top ferromagnetic layer $F_1$ of the AAF free stack 220 can be partially or totally destroyed by any suitable destruction method. The destruction method should be so as to result in a conversion of the material from magnetic to non-magnetic. Examples of suitable destruction methods include oxidation, ion implantation or doping using diffusion. For example the magnetic property of the upper magnetic layer $F_1$ can be locally destroyed by oxidation. The oxidation process should penetrate through the capping layer 241, down to magnetic layer $F_1$ and should stop on the interlayer 221.

Alternatively the destruction can be done by ion implantation or doping using diffusion. Ion-implantation is a well-known technique, as described for example in U.S. Pat. No. 6,153,281. Implanted ions can e.g. be Cr, O, N, Nb, Si etc. and the implantation can be performed at the normal direction to the substrate or under an angle. It is important that the implant profile 260, illustrated in FIG. 30, is shallow. This may be obtained by using low ion energy and optimizing the implant dose and beam angle. Furthermore, the implant zone must be confined within the topmost magnetic layer $F_1$, which may be obtained by tunning the implant dose.

According to a further embodiment, yet another method to obtain that the net magnetic moment of the free region 220 becomes non-zero can be to add another ferromagnetic layer $F_3$ (not represented in the drawings) directly on top of the top ferromagnetic layer $F_1$ of the AAF free stack 220 after the capping layer 241 is removed by any suitable method, for example by an etching technique. By adding a magnetic layer, the magnetic moment of the combined layer comprising $F_1$ and $F_3$ becomes larger than that of F2, resulting in an unbalanced AAF structure. As an alternative, the full layer structure of $F_1$, $F_2$ and $F_3$ can be deposited in one go. Therefore, initially also the MRAM part of the chip will have an extra layer that needs to be removed afterwards, adding process complexity. Given the fact that MRAM is the main functionality of the IC, this is in most cases not acceptable.

According to another embodiment, an alternative method to obtain that the net magnetic moment of the free region 220 becomes non-zero can be to locally convert the anti-ferromagnetic coupling between the ferromagnetic layers $F_1$, $F_2$ of the AAF free region 220 (partly) into a ferromagnetic coupling. This may be obtained by locally annealing the AAF free stack 220, resulting in ferromagnetically coupled regions between the magnetic layers $F_1$ and $F_2$, due to interdiffusion with the Ru interlayer 221. This causes remanence (and thus a non-zero net magnetic moment) in the AAF free stack 220. In this embodiment, no extra mask layer has to be inserted into the MRAM base-line process flow. Local heating can be created during the testing phase.

This latter embodiment is different from previous embodiments in the sense that no mask may be required. It is known from US2004/0120184 that the AAF free stack 220 may be changed locally by annealing. This has recently been proposed for reducing the write power in the toggle write MRAM concept. In US2004/0120184 the AAF free stack 220 is annealed at moderate temperature resulting in weakly coupled regions in the AAF 220, and consequently resulting in a lower spin-flop field. Typically 10-20% of the sample area would be modified by doing so.

It has been experimentally observed that when annealed at higher temperature, these weakly (antiferromagnetically) coupled regions will grow and ultimately develop into regions in which the ferromagnetic layers $F_1$ and $F_2$ are ferromagnetically coupled. As a consequence, the sample will exhibit remanence (non-zero net magnetic field) at zero externally applied magnetic field (see FIG. 31). FIG. 31 illustrates hysteresis loops of an AAF free stack 220 comprising a 4 nm NiFe layer $F_1$, a 0.7 nm Ru interlayer 221 and another 4 nm NiFe layer $F_2$. Annealing has been performed at 240° C. for 15 minutes. It can clearly be seen in the inset of FIG. 31 that after anneal, the stack develops a substantial non-zero remanence magnetization, indicating that, at least in parts of the film, a ferromagnetic coupling is present between the ferromagnetic layers $F_1$ and $F_2$.

A particular means can be included into the sensor area to create extra heat locally, e.g. by excess current annealing during a particular anneal step. In such a step, only regions where excess power is dissipated will have an elevated temperature that is sufficient to initiate diffusion processes and ultimately weakly coupled regions formation in the AAF. A different approach may be to locally heat the stack using focused laser light. Given the fact that sensors are not located in the vicinity of the MRAM array, a rather coarse lighting system may be sufficient for this purpose.

Figure 32:
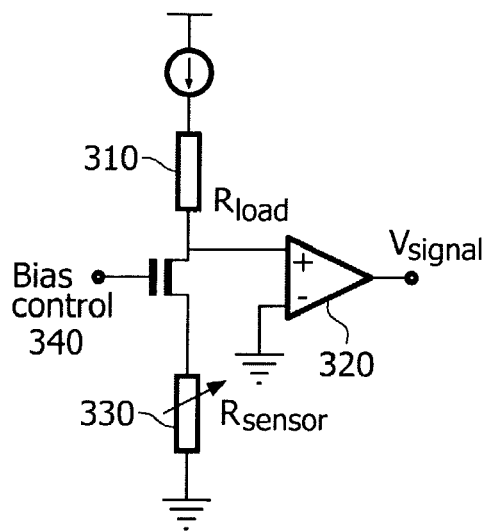
FIGS. 32 and 33 show readout circuits for sensors according to embodiments of the invention.

Once the MTJ detection elements have been formed, either of the conventional type or of the toggle type of MRAM stack, any suitable conventional circuitry can be used as the detection circuitry for measuring the resistance of the sensing element, to suit the application. For high performance applications, two alternative readout circuits are presented in FIGS. 32 and 33, which are in principle the same as readout circuits for MRAMs. As shown in FIG. 32, an op-amp 320 is used to amplify a voltage seen across a load resistor 310, which is coupled in series with the sensor 330, via a bias transistor 340. In FIG. 32, the bias voltage on the sensor is clamped to a relatively fixed value (about 200 mV) and the change in resistance of the sensor causes a change in current, which results in a voltage change on the load resistor. This voltage change is then amplified. A disadvantage of the circuit is that it results in some variation of the clamping voltage when the resistance of the sensor is changed.

Figure 33:
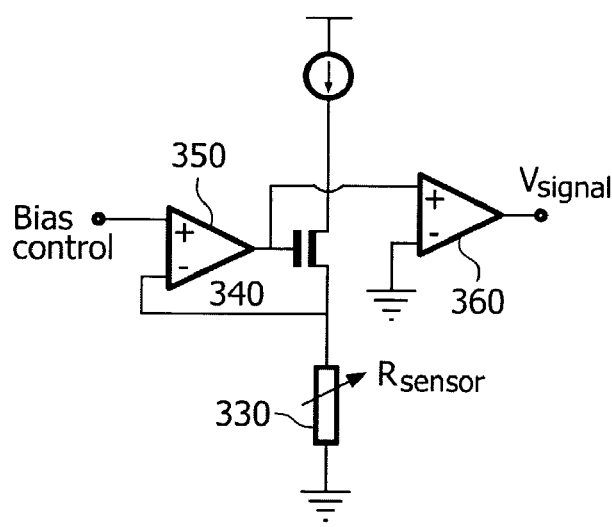

In FIG. 33, an improved circuit is presented, using material from U.S. Pat. No. 6,205,073 B1, in the context of MTJ memory readout. In this design, there are two op amps. An output op-amp 360 amplifies the output of a bias control op-amp 350. The bias control op-amp output is also fed to an input of the bias transistor 340. A negative input of op-amp 350 is fed by the voltage across the sensor. In this design, the negative feedback of the bias control op-amp allows an active way of clamping the voltage on the sensor 330, which can offer a more stable signal and faster readout time.

Figure 34:
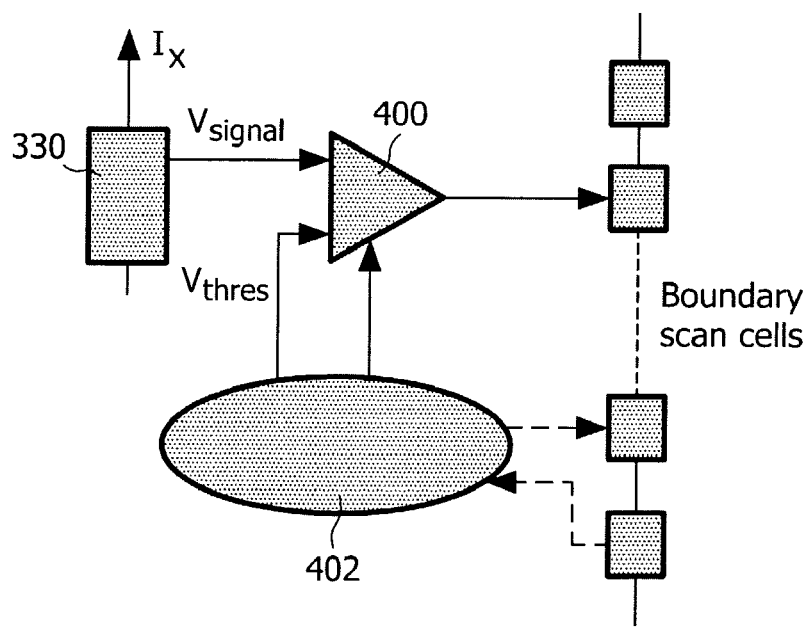
FIG. 34 illustrates a basic current detection scheme according to an embodiment of the present invention.

The output $V_{signal}$ of the sensor module 330, which for example resembles the circuit shown in FIG. 32 or 33, can be read out, as illustrated in FIG. 34, through a sensor read-out amplifier 400, that has a second input $V_{thres}$ to make a comparison possible with a pre-determined threshold. In FIG. 34, the comparison signal ($V_{thres}$) originates from control logic 402 and may even be a programmable level. The resulting higher or lower signal (than the threshold voltage) obtained on the output of the amplifier 400 is basically a digital signal and can preferably be transferred to an output pin by means of e.g. a boundary scan set up containing boundary scan cells using internal registers according to the IEEE standard 1149.1 (FIG. 34).

Figure 35:
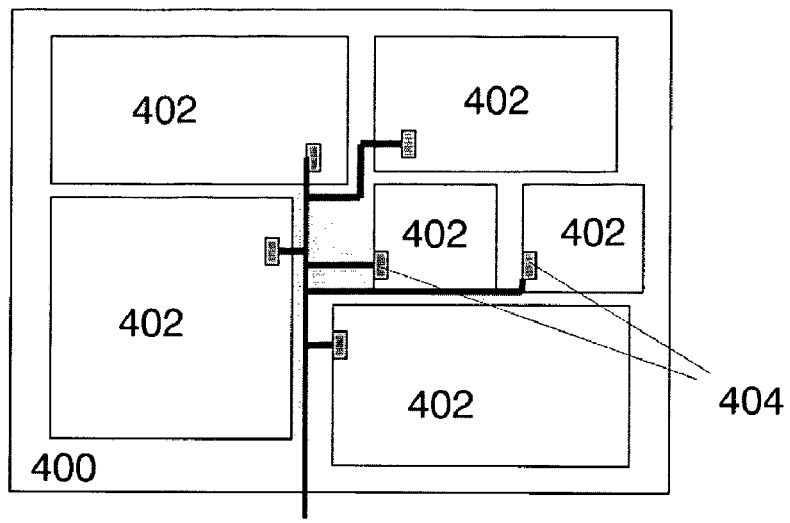
FIG. 35 illustrates a system on chip (SOC) where the applied core blocks all have a current sensor that may be a set of distributed sensors per core.

The invention makes it possible to use a multitude of sensors to measure currents as consumed by different blocks to determine the part of the design that consumes too much or too little current. FIG. 35 illustrates a system on chip (SOC) 400 where the applied core blocks 402 all have a current sensor units 404 (that may be a set of distributed sensors per core). The sensor units 404 are connected to an access means (preferably a boundary scan set up like in FIG. 34). The check capability may be an additional processing function on this chip (not represented in the drawing). Through boundary scan, the check capability may also be placed outside the chip. Wear-out of the IC during its life time can be monitored.

Figure 36:
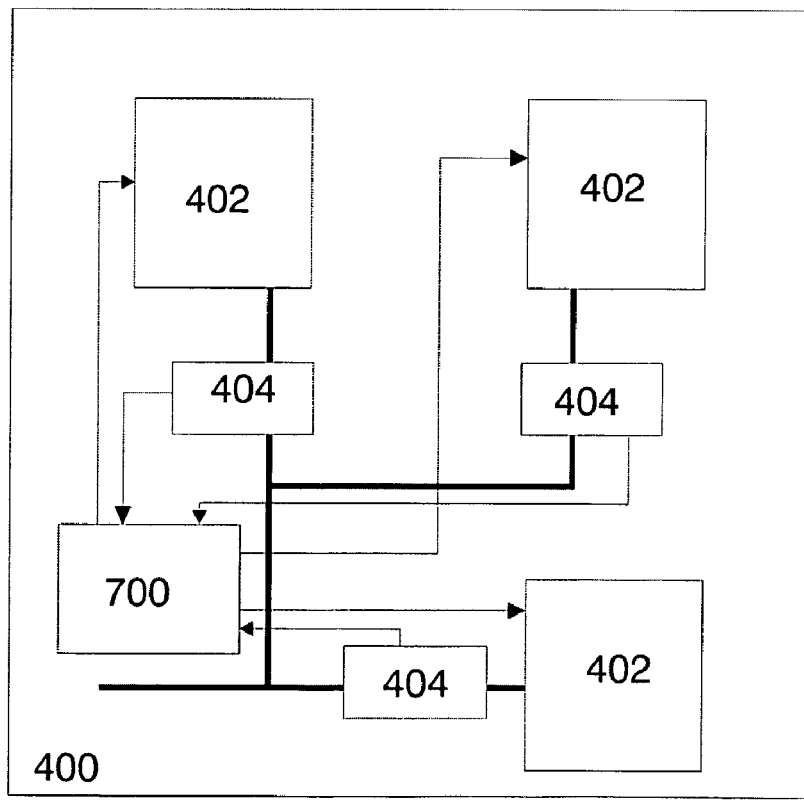
FIG. 36 illustrates a system on chip (SOC) where the output from the current sensors in the applied core blocks is connected to a task scheduler.

A more specific example is given in FIG. 36, in which current sensors are positioned on the power supply lines of at least one processing module or core. The power distribution network has been shown in a simplified form and would normally be much more complex than that schematically shown in FIGS. 35 and 36. The outputs of the current sensors 404 are fed into a central task scheduler 700. The function of the scheduler 700 is to gather information about the power consumption of different modules or cores 402 and then determine the scheduling of tasks based on dynamic power distribution schemes. The scheduler 700 may be implemented in software running on a suitable processing device such as a conventional microprocessor, e.g. an embedded microprocessor or programmable digital logic device such as a Programmable Gate Array, e.g. Programmable Array Logic, Programmable Logic Array, Field Programmable Gate Array or similar. The cores 402 are processing units that consume power and may get hot when running at their maximum capacity. Based on the current (power) measurement per processing unit, a more even processing load can be scheduled, i.e. the task scheduler 700 can perform load balancing. Loading controls are then fed back to the cores 402. This functionality is especially useful in systems that have many parallel processing units. This prevents unnecessary waiting queues, but also excessive heat build up in a specific core 402 may be prevented. Also power reduction schemes may be controlled in this way, thus preventing expensive heat transfer solutions at assembly level. In other examples (not shown), the task scheduler 700 can be replaced by different circuitries which have different functionalities such as a measurement unit or an interrupt generator. From there, a contact will be made either to an internal block or to the outside world or to a software environment for further work such as other control or monitoring jobs.

The current sensors described in any of the embodiments above can be implemented in integrated circuits of many kinds, particularly CMOS circuits and MRAM circuits. Outputs of such sensors can be coupled in scan chains following established practice, to multiplex many sensor outputs onto one or more outputs of the integrated circuit. Such integrated circuits can be used in conventional consumer equipment, particularly mobile devices such as laptop computers, mobile phones and safety systems such as ABS for cars and avionics and so on. As has been described above, a sensor for detecting magnetic field strength created by the current to be measured, has a sensor element using a magnetic tunnel junction, and detection circuitry, the sensor element having a resistance which varies with the magnetic field, the sensor element comprises a tunnel junction, and the detection circuitry is arranged to detect a tunnel current flowing across the tunnel junction. Anisotropy, such as caused by elongation, is oriented at an angle, preferably orthogonal to the magnetic field. Advantages include greater sensitivity, and thus less susceptibility to noise. Also it can provide easy integration with next generation CMOS processes, be more compact, and use less power. The greater sensitivity enables less post processing to be used, to save power for applications such as mobile devices. Applications include current sensors, built in current sensors, and IDDQ testing, even for next generation CMOS processes. Other variations can be envisaged within the scope of the claims.

The invention claimed is:

1. A semiconductor device comprising:
   a conductive element;
   a current sensor, wherein the current sensor is a magnetic current sensing device for sensing direct, varying or alternating current flowing through the conductive element wherein the current sensing device is integrated in the semiconductor device where the current to be measured is generated and the current sensor is galvanically isolated from the conductive element, wherein the current sensing device comprises at least one TMR device.

2. A Semiconductor device according to claim 1, wherein the current sensor is suitable for measuring current with a pA resolution.

3. A semiconductor device according to claim 1, wherein the current sensing device shares an MTJ stack with an MRAM device.

4. A semiconductor device according to claim 3, wherein the MTJ stack comprises:
   an electrically insulating material designed to form a magneto-resistive tunnelling barrier,
   a pinned magnetic region positioned on one side of the electrically insulating material, the pinned magnetic region having a magnetic moment vector adjacent the electrically insulating material,
   a nearly balanced free magnetic region positioned on an opposite side of the electrically insulating material, the free magnetic region having a magnetic moment vector adjacent the insulating material and oriented in a position parallel or anti-parallel to the magnetic moment vector of the pinned magnetic region, the free magnetic region including an artificial anti-ferromagnetic layer material including N ferromagnetic layers which are antiferromagnetically coupled, where N is an integer greater than or equal to. two.

5. A semiconductor device according to claim 1, wherein the current sensing device has a free magnetic layer which has an easy axis oriented to be substantially perpendicular to a magnetic field caused by current under measurement.

6. A semiconductor device according to claim 5, the current sensing device having an easy axis, wherein the easy axis of the free layer is caused by shape elongation.

7. A semiconductor device according to claim 1, wherein the current sensing device is subjected to an additional magnetic field that can either be direct, varying or alternating.

8. A semiconductor device according to claim 1, the current sensing device having a pinned magnetic layer with a magnetisation direction and a free magnetic layer having an easy axis, wherein the magnetisation direction of the pinned magnetic layer is oriented at an angle, with the easy axis of the free magnetic layer, preferably between 45° and 135°, more preferred substantially perpendicular to the easy axis of the free magnetic layer.

9. A semiconductor device according to claim 1, the semiconductor device comprising adjacent a first side of the current sensing device a first conductor for conveying a current ($I_x$) to be measured and adjacent a second side of the current sensing device a second conductor for conducting current ($I_2$), the first conductor and the second conductor crossing but not being electrically connected.

10. A semiconductor device according to claim 9, the free magnetic layer of the current sensing device having an easy axis, wherein the first conductor and the second conductor each include an angle of substantially between 30° and 90° with respect to the easy axis of the current sensing device.

11. A semiconductor device according to claim 9, furthermore comprising a feedback circuit for measuring MR changes on the current sensing device and for controlling current ($I_2$) in the second conductor in such a way that no MR change is observed on the current sensing device.

12. A semiconductor device according to claim 11, wherein the current feedback circuit has means for generating a feedback signal indicative of the current ($I_x$) to be measured and conveyed by the first conductor.

13. A semiconductor device according to claim 9, wherein at least one of the first conductor and the second conductor comprises at least one vertical conduction component and at least one horizontal conduction component, there being a corner between the vertical conduction component and the horizontal conduction component, thus forming a conductor structure which at least includes an L-shaped part of which the corner is located adjacent the current sensing device.

14. A semiconductor device according to claim 1, furthermore comprising a flux-concentrator to increase the magnetic field at the location of the current sensing device.

15. A semiconductor device according to claim 14, wherein the flux-concentrator comprises a dummy MTJ stack which is patterned around at least one vertical conduction component.

16. A semiconductor device according to claim 14, wherein the flux-concentrator is ring-shaped and comprises a gap between poles, the current sensing device being located in the gap.

17. A semiconductor device according to claim 1, wherein the sensor device is compatible with CMOS or MOS processing.

18. A semiconductor device according to claim 1, wherein the semiconductor device is an integrated circuit.

19. A semiconductor device according to claim 18, wherein the current sensor or sensors are arranged to sense quiescent currents (IDDQ) or transient currents (IDDT).

20. A method for manufacturing a semiconductor device according to claim 1, the method comprising providing an MTJ stack.

21. A method for manufacturing a semiconductor device according to claim 1, the method comprising providing an MTJ stack,
   wherein providing the MTJ stack comprises depositing a free region, wherein depositing a free region comprises depositing an artificial anti-ferromagnetic free region comprising a plurality of anti-ferromagnetically coupled ferromagnetic layers, and the artificial anti-ferromagnetic free region having a net magnetic moment which is substantially zero, the method furthermore comprising modifying the net magnetic moment of the free region so as to make it non-zero.

* * * * *